United States Patent
Yamazaki

(10) Patent No.: US 7,256,422 B2
(45) Date of Patent: Aug. 14, 2007

(54) EL DISPLAY DEVICE AND ELECTRONIC DEVICE

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 547 days.

(21) Appl. No.: 10/914,350

(22) Filed: Aug. 9, 2004

(65) Prior Publication Data

US 2005/0006667 A1   Jan. 13, 2005

Related U.S. Application Data

(63) Continuation of application No. 10/404,247, filed on Apr. 1, 2003, now Pat. No. 6,774,573, which is a continuation of application No. 10/079,109, filed on Feb. 20, 2002, now Pat. No. 6,552,496, which is a continuation of application No. 09/603,282, filed on Jun. 26, 2000, now Pat. No. 6,380,687.

(30) Foreign Application Priority Data

Jun. 28, 1999  (JP) .................................. 11-182590

(51) Int. Cl.
*B21J 19/04*  (2006.01)
(52) U.S. Cl. ...................... 257/59; 257/350; 438/149; 438/213; 345/92; 345/100; 315/169.2; 315/139.3
(58) Field of Classification Search ............. 315/169.1, 315/169.2, 169.3; 345/90, 92, 98, 100; 257/59, 257/72, 347, 350; 438/149, 161, 199, 213; 313/505, 506

See application file for complete search history.

(56) References Cited

U.S. PATENT DOCUMENTS

| 4,356,429 A | 10/1982 | Tang ........................... 313/503 |
| 4,539,507 A | 9/1985 | VanSlyke et al. ........... 313/504 |
| 4,720,432 A | 1/1988 | VanSlyke et al. ........... 428/457 |
| 4,769,292 A | 9/1988 | Tang et al. .................. 428/690 |
| 4,885,211 A | 12/1989 | Tang et al. .................. 428/457 |
| 4,950,950 A | 8/1990 | Perry et al. .................. 313/504 |
| 5,047,687 A | 9/1991 | VanSlyke ..................... 313/503 |
| 5,059,861 A | 10/1991 | Littman et al. ............. 313/503 |
| 5,059,862 A | 10/1991 | VanSlyke et al. ........... 313/503 |

(Continued)

FOREIGN PATENT DOCUMENTS

EP   0 717 445   6/1996

(Continued)

OTHER PUBLICATIONS

Pending U.S. Appl. No. 09/551,866, to Yamauchi filed Apr. 18, 2000, including specification, claims, abstract, drawings and PTO filing receipt.

(Continued)

*Primary Examiner*—Haissa Philogene
(74) *Attorney, Agent, or Firm*—Cook, Alex, McFarron, Manzo, Cummings & Mehler, Ltd.

(57) ABSTRACT

An electroluminescence display device has a plurality of electroluminescence elements and a driver circuit formed over a substrate. At least a part of the driver circuit is disposed in a display portion of a substrate in order that the size of the display device can be reduced.

21 Claims, 12 Drawing Sheets

U.S. PATENT DOCUMENTS

| | | | |
|---|---|---|---|
| 5,061,617 A | 10/1991 | Maskasky | 430/569 |
| 5,073,446 A | 12/1991 | Scozzafava et al. | 428/323 |
| 5,151,629 A | 9/1992 | VanSlyke | 313/504 |
| 5,294,869 A | 3/1994 | Tang et al. | 313/504 |
| 5,294,870 A | 3/1994 | Tang et al. | 313/504 |
| 5,323,042 A | 6/1994 | Matsumoto | 257/350 |
| 5,412,240 A | 5/1995 | Inoue et al. | 257/347 |
| 5,583,347 A | 12/1996 | Misawa et al. | 257/72 |
| 5,619,044 A * | 4/1997 | Makita et al. | 257/64 |
| 5,661,371 A | 8/1997 | Salerno et al. | 315/169.3 |
| 5,670,792 A | 9/1997 | Utsugi et al. | 257/59 |
| 5,677,600 A | 10/1997 | Takahashi et al. | 315/169.4 |
| 5,712,652 A | 1/1998 | Sato et al. | 345/90 |
| 5,748,165 A | 5/1998 | Kubota et al. | 345/96 |
| 5,790,213 A | 8/1998 | Sasaki et al. | 349/48 |
| 5,798,746 A | 8/1998 | Koyama | 345/98 |
| 5,882,761 A | 3/1999 | Kawami et al. | 428/69 |
| 5,962,962 A | 10/1999 | Fujita et al. | 313/412 |
| 6,046,547 A | 4/2000 | Nishio et al. | 315/169.3 |
| 6,147,451 A | 11/2000 | Shibata et al. | 313/506 |
| 6,165,543 A | 12/2000 | Otsuki et al. | 428/66 |
| 6,165,824 A | 12/2000 | Takano et al. | 438/160 |
| 6,198,225 B1 | 3/2001 | Kano et al. | 315/169.3 |
| 6,384,818 B1 | 5/2002 | Yamazaki et al. | 345/206 |
| 6,636,194 B2 | 10/2003 | Ishii | 345/98 |
| 2003/0151582 A1 | 8/2003 | Ishii | 345/100 |

FOREIGN PATENT DOCUMENTS

| | | |
|---|---|---|
| EP | 1 020 840 A1 | 7/2000 |
| JP | 62-090260 | 4/1987 |
| JP | 4-350627 | 12/1992 |
| JP | 6-102530 | 4/1994 |
| JP | 8-078159 | 3/1996 |
| JP | 8-241048 | 9/1996 |
| JP | 9-148066 | 6/1997 |
| JP | 10-082994 | 3/1998 |
| JP | 10-104663 | 4/1998 |
| JP | 10-189252 | 7/1998 |
| JP | 10-247735 | 9/1998 |
| JP | 11-054268 | 2/1999 |
| WO | WO 00/008625 | 2/2000 |

OTHER PUBLICATIONS

Pending U.S. Appl. No. 09/578,895, to Yamazaki et al filed May 25, 2000, including specification, claims, abstract, drawings and PTO filing receipt.

Pending U.S. Appl. No. 08/937,377, to Yamazaki et al, filed Sep. 25, 1997, including specification, claims, abstract, drawings and PTO filing receipt.

European Search Report re application No. EP 00113576.3, dated Apr. 11, 2006.

* cited by examiner

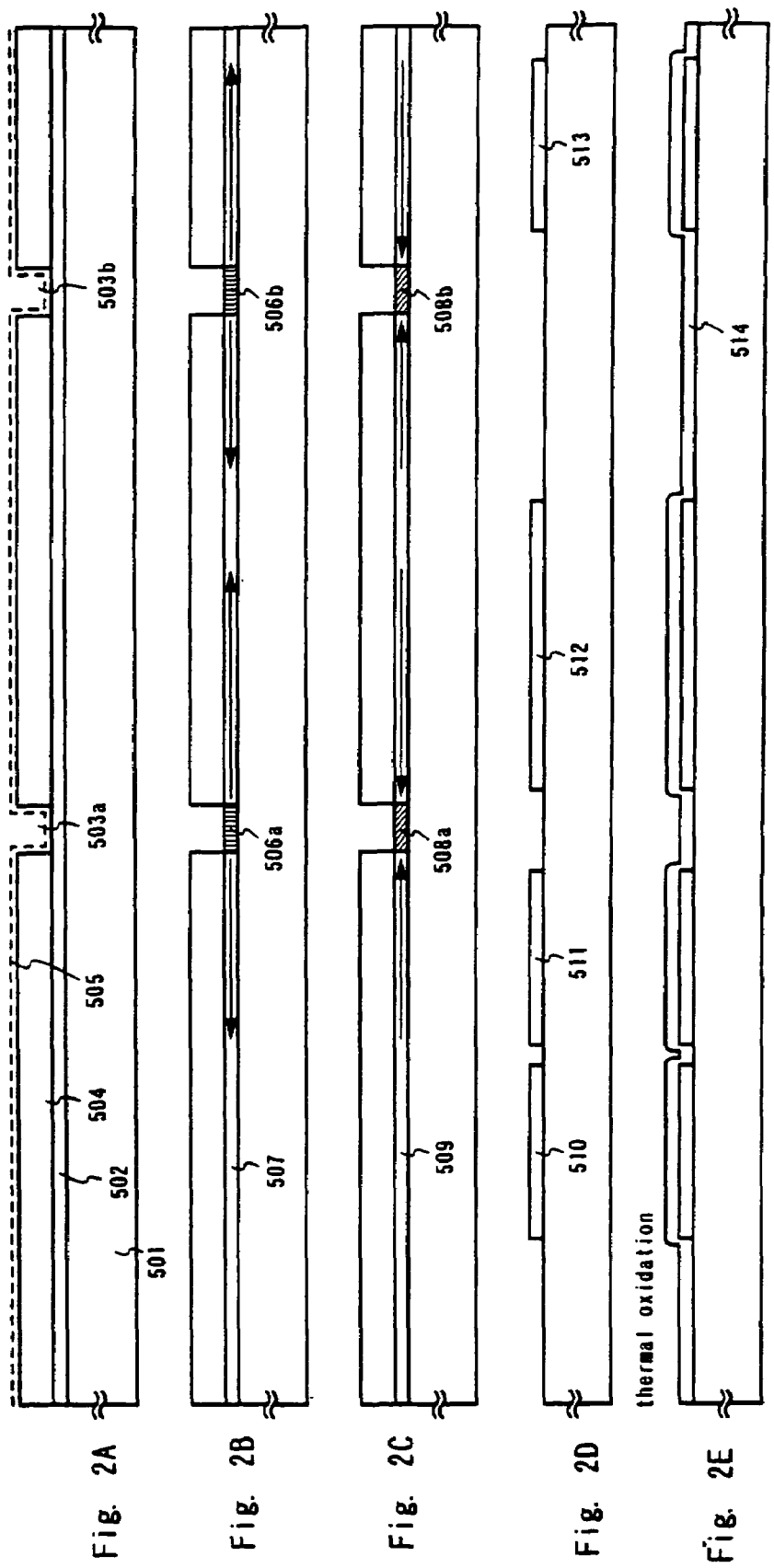

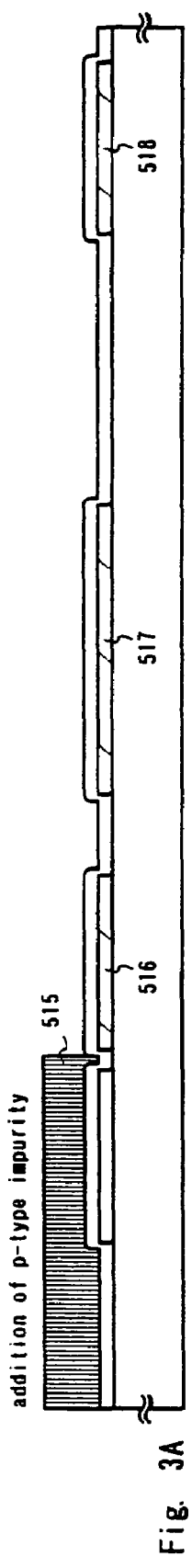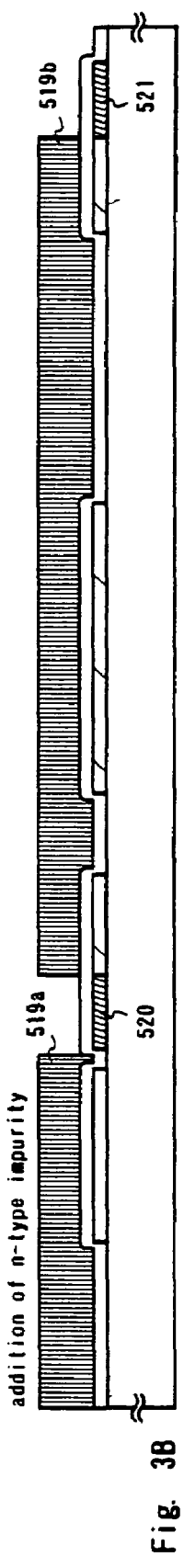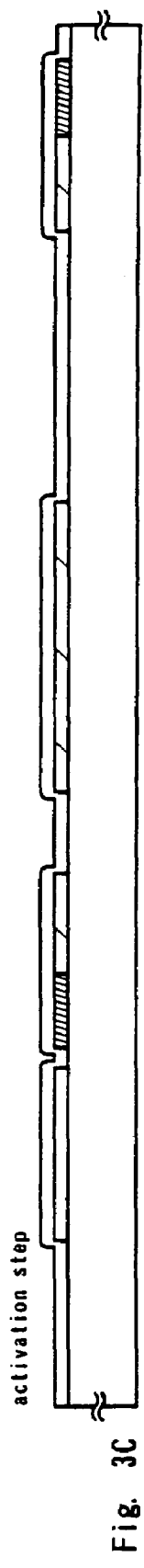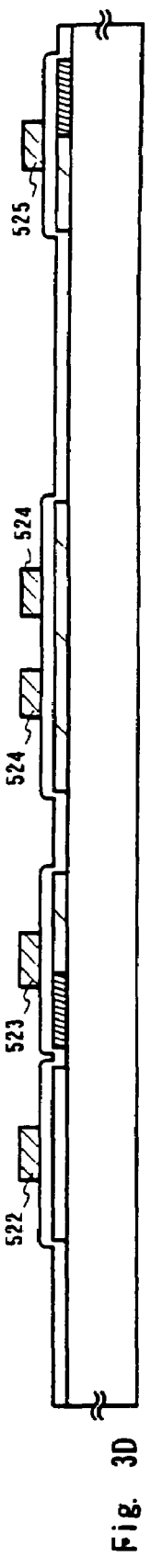

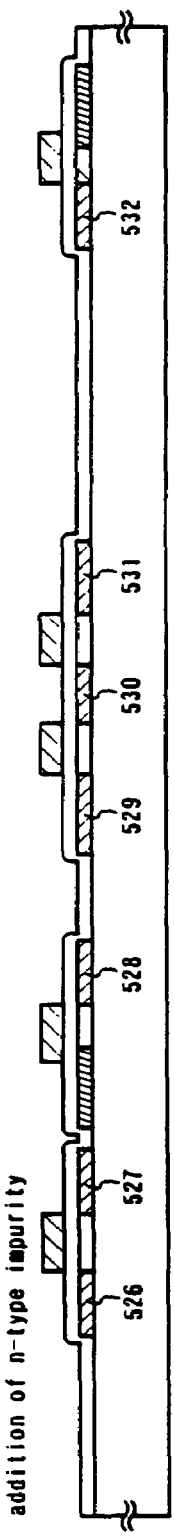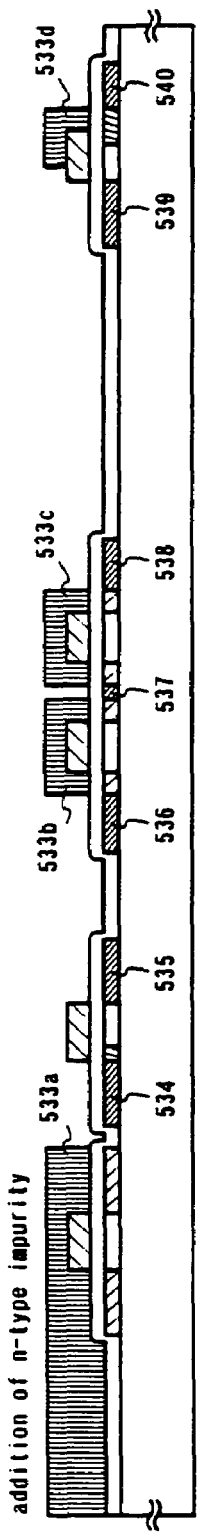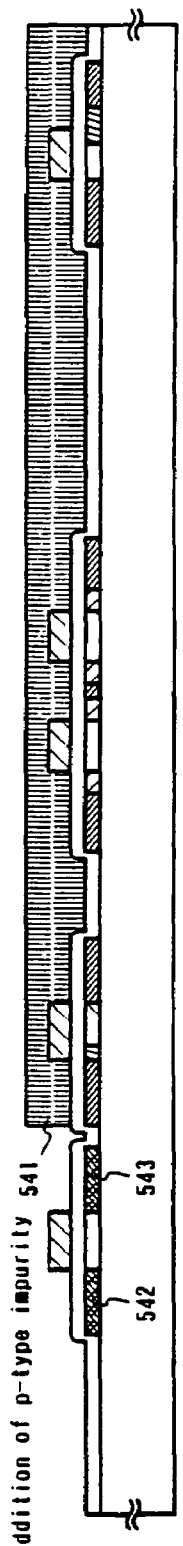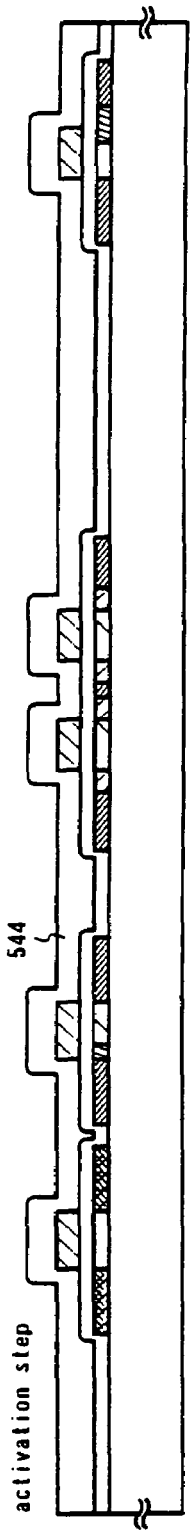

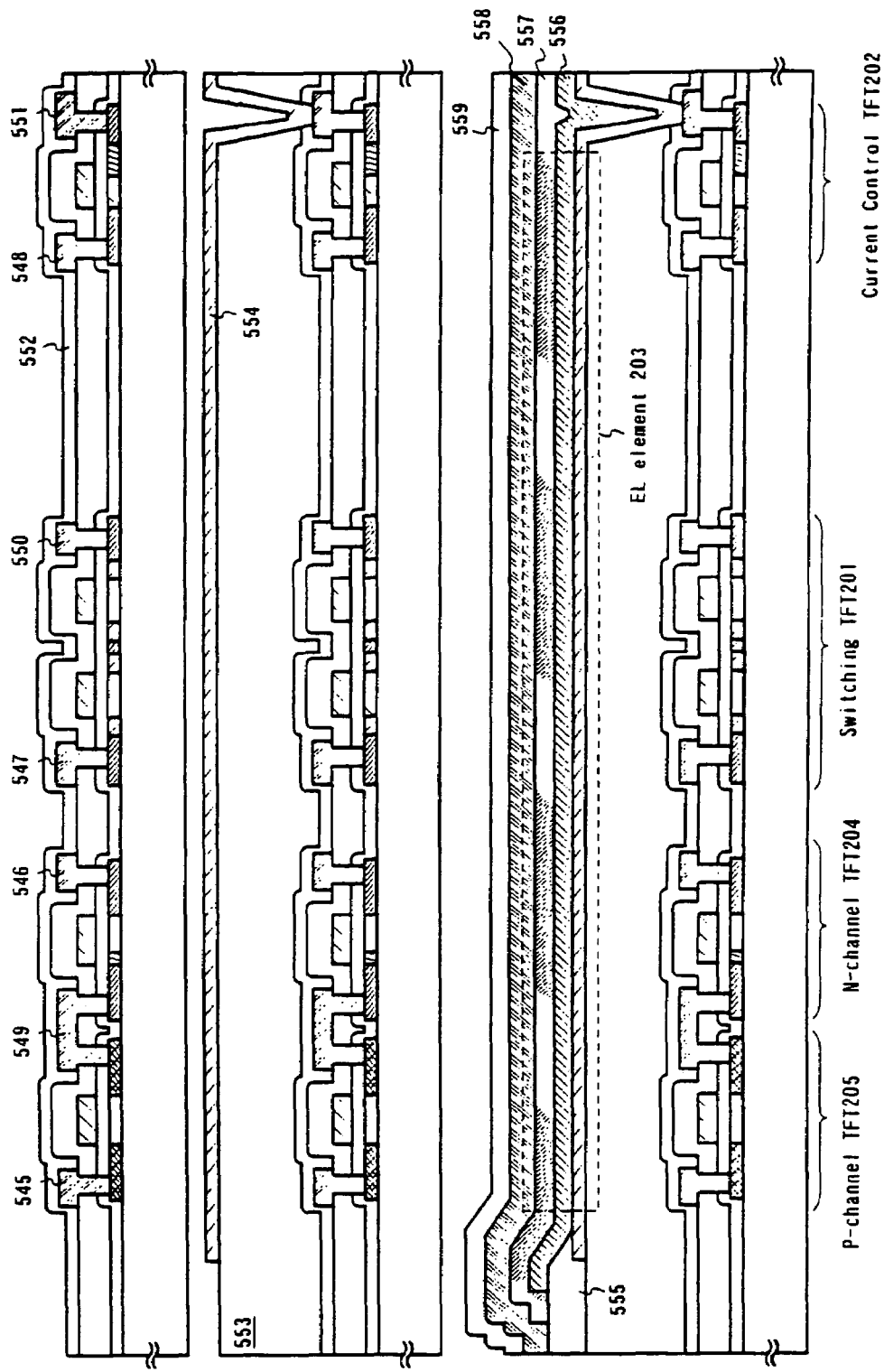

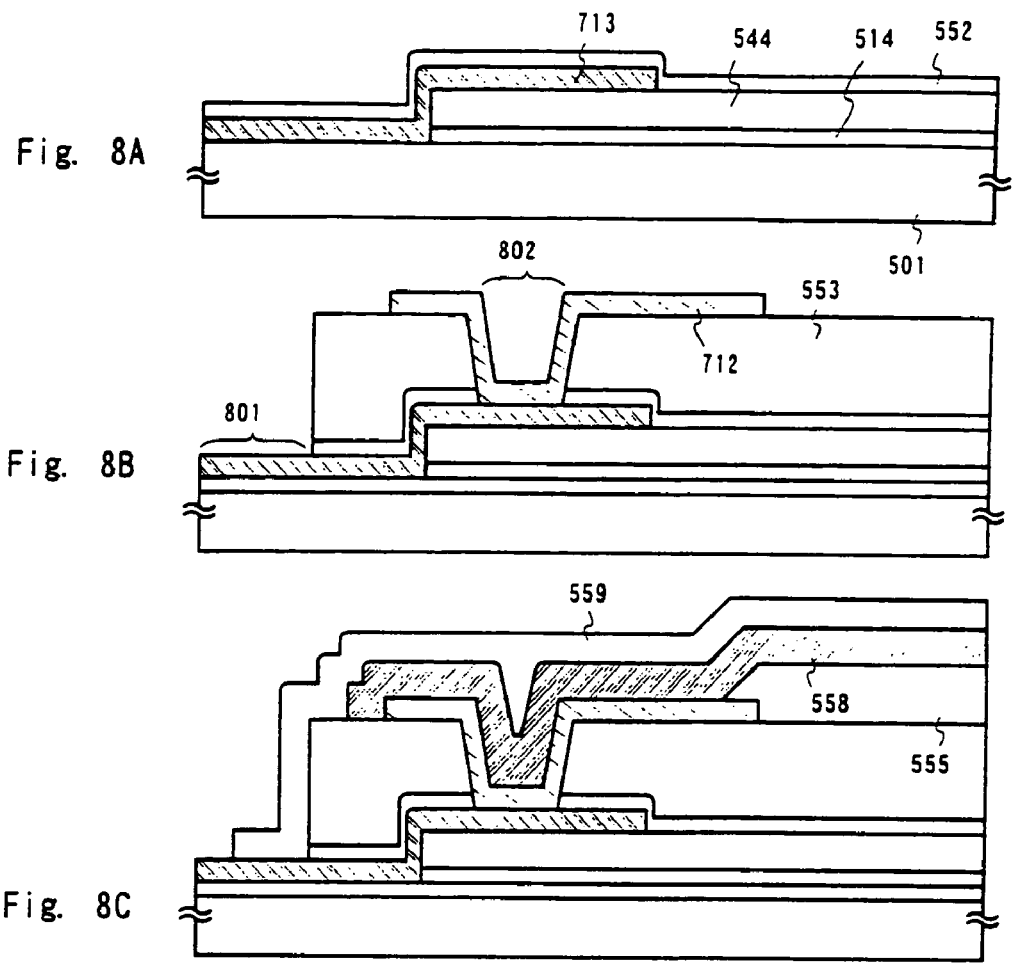
Fig. 8A
Fig. 8B
Fig. 8C
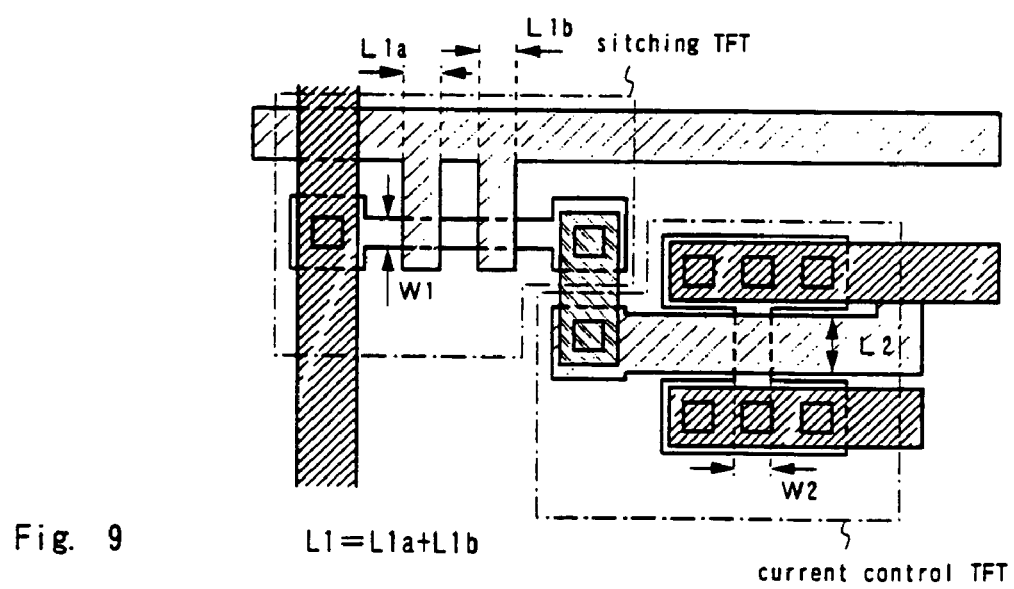
Fig. 9

Fig. 10

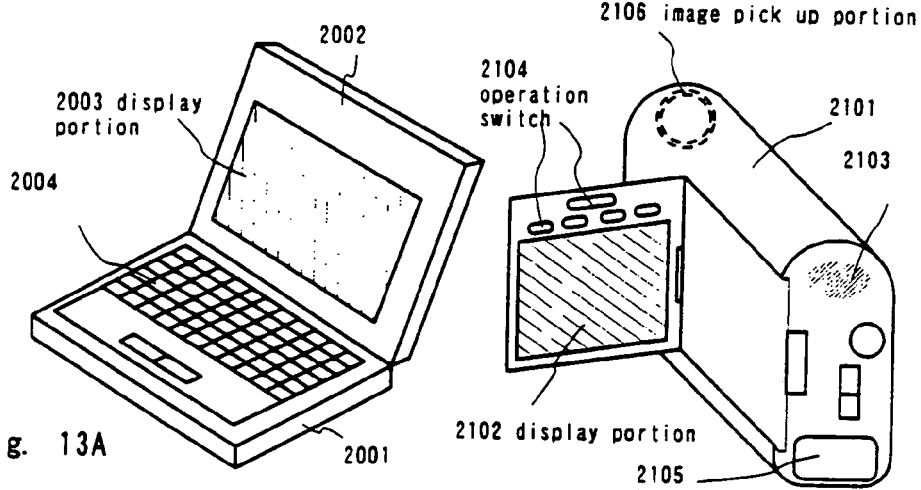
Fig. 13A
Fig. 13B
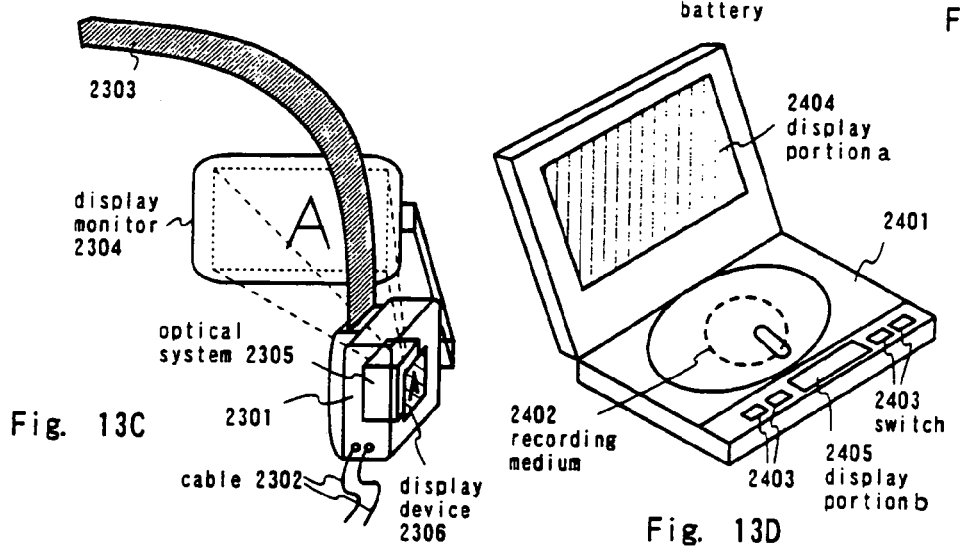
Fig. 13C
Fig. 13D
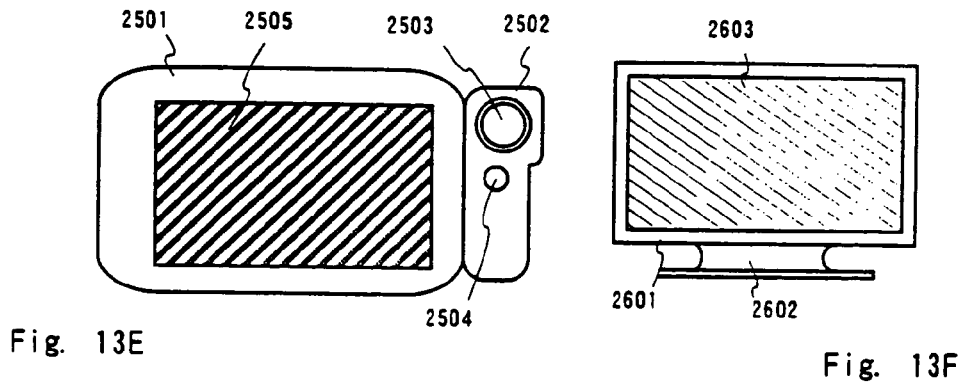
Fig. 13E
Fig. 13F

EL DISPLAY DEVICE AND ELECTRONIC DEVICE

This application is a continuation of U.S. application Ser. No. 10/404,247, filed on Apr. 1, 2003 now U.S. Pat. No. 6,774,573 which is a continuation of U.S. application Ser. No. 10/079,109 filed on Feb. 20, 2002 now U.S. Pat. No. 6,552,496 which is a continuation of U.S. application Ser. No. 09/603,282 filed on Jun. 26, 2000 now U.S. Pat. No. 6,380,687.

BACKGROUND OF THE INVENTION

1. Field of the Invention

The present invention relates to an EL (electroluminescence) display device formed of a semiconductor element (an element using a semiconductor thin film) built into a substrate, and to an electronic device (an electronic device) having the EL display device as a display.

2. Description of the Related Art

Techniques of forming a TFT on a substrate have been widely progressing in recent years, and development of applications thereof to an active matrix type display device are advancing. In particular, a TFT using a polysilicon film has a higher electric field effect mobility ($\mu_{FE}$) than a TFT using a conventional amorous silicon film, and high speed operation is therefore possible. As a result, it becomes possible to perform pixel control, conventionally performed by a driving circuit external to the substrate, by the driving circuit formed on the same substrate as a pixel.

This type of active matrix display device has been in the spotlight because of the many advantages which can be obtained by incorporating various circuits and elements on the same substrate in this type of active matrix display device, such as reduced manufacturing cost, display device miniaturization, increased yield, and higher throughput.

In a monolithic type display device having a pixel portion and a driving circuit for driving the pixel portion on the same substrate, the driving circuit is formed in the periphery of the pixel portion, and therefore, compared to forming only the pixel portion on the substrate, the required substrate size becomes larger by the size of the driving circuit. Consequently, the number of display devices which can be cut out of one substrate changes with how small the exclusive surface area of the driving circuit can be made.

In particular, in a display device whose pixel portion has a diagonal of 1 inch or less, it is necessary to load the driving circuit on an extremely small substrate, and the exclusive surface area of the driving circuit imparts a large influence on the substrate size. However, regardless of the size of the pixel portion, the driving circuit functions are the same, and in order to form a circuit with identical functions in a very small area, various factors such as increasing the TFT characteristics and techniques of miniaturization become key points.

SUMMARY OF THE INVENTION

The present invention has been made in view of the problems above, and an object of the present invention is to further miniaturize an active matrix type EL display device, and to reduce manufacturing cost. In addition, another object of the present invention is to further miniaturize an electronic device provided with the active matrix type EL display device as a display, and to reduce manufacturing cost.

An EL element is formed for each pixel in an active matrix type EL display device. EL element refers to a light emitting element comprised of a cathode, an EL layer, and an anode here. The output light of the EL element (hereafter referred to as EL light) is output either from a substrate side or from the side opposite to the substrate. This is shown in FIGS. 6A and 6B.

In the structure of FIG. 6A, the EL element is formed of a pixel electrode (anode) made from ITO (indium tin oxide), an EL layer, and an MgAg electrode (cathode), in order from the bottom of the EL element. Further, the cathode itself is thin, and therefore a protecting electrode (an aluminum electrode here) is formed in order to protect, and at the same time to supplement, the cathode function. In this case the EL light is output from the side of the substrate on which a TFT is formed. Therefore, out of the entire pixel electrode surface area, the portion under which the TFT and wirings are not formed becomes an effective luminescing region.

On the other hand, in the structure of FIG. 6B, the EL element is formed of a pixel electrode (anode) made from an aluminum film, an MgAg electrode (cathode), an EL layer, and an ITO electrode (anode), in order from the bottom of the EL element. In this case, the EL light does not transmit through the pixel electrode, and therefore all of the light is output to the side opposite to the substrate (the top side of the EL display device). The entire surface area of the pixel electrode therefore becomes the effective luminescing region.

For the case of FIG. 6A it is thus important to form as few elements or wirings as possible under the pixel electrode. However, in the case of FIG. 6B, there is no relationship, no matter what is formed under the pixel electrode, which is an utterly dead space.

To clarify the main point of the present invention, the invention aims to effectively utilize the dead space under the pixel electrode in an active matrix type EL display device in which the EL element is made to emit light by a method like that of FIG. 6B. Specifically, a driving circuit for driving a pixel portion is formed under the pixel electrode of each pixel arranged in a matrix state in the pixel portion. In addition, other signal processing circuits (such as a wave divider circuit, a booster circuit, a γ compensation circuit, memory, and a differential amplifier circuit), not only the driving circuit, may also be formed.

In other words, the circuits and elements conventionally formed in the periphery of the pixel portion are arranged in the dead space within the pixel portion, and the substrate surface area can be effectively utilized. Note that elements, such as a protecting element used as a countermeasure against ESD (electro-static degradation), are included as elements formed in the periphery of the pixel portion.

Furthermore, the present invention is not only applicable to the active matrix type EL display device, but is also applicable to an EL display device which has a driving circuit formed on the same substrate and has a pixel portion of a simple matrix type. In other words, the present invention is effective for EL display devices in which the EL light in the pixel portion is output to the side opposite that of the substrate, and in which other circuits or elements are formed on the substrate.

BRIEF DESCRIPTION OF THE DRAWINGS

In the accompanying drawings:

FIGS. 2A to 2E are diagrams showing a process of manufacturing an EL display device;

FIGS. 3A to 3D are diagrams showing the process of manufacturing the EL display device;

FIGS. 4A to 4D are diagrams showing the process of manufacturing the EL display device;

FIGS. 5A to 5C are diagrams showing the process of manufacturing the EL display device;

FIGS. 8A to 8C are diagrams showing a process of manufacturing a contact structure;

FIG. 9 is a diagram showing the composition of a pixel portion of an EL display device;

FIG. 10 is a diagram showing the cross sectional structure of an EL display device;

FIGS. 13A to 13F are diagrams showing specific examples of electronic devices.

DETAILED DESCRIPTION OF THE PREFERRED EMBODIMENTS

EMBODIMENT MODE

Figure 1:
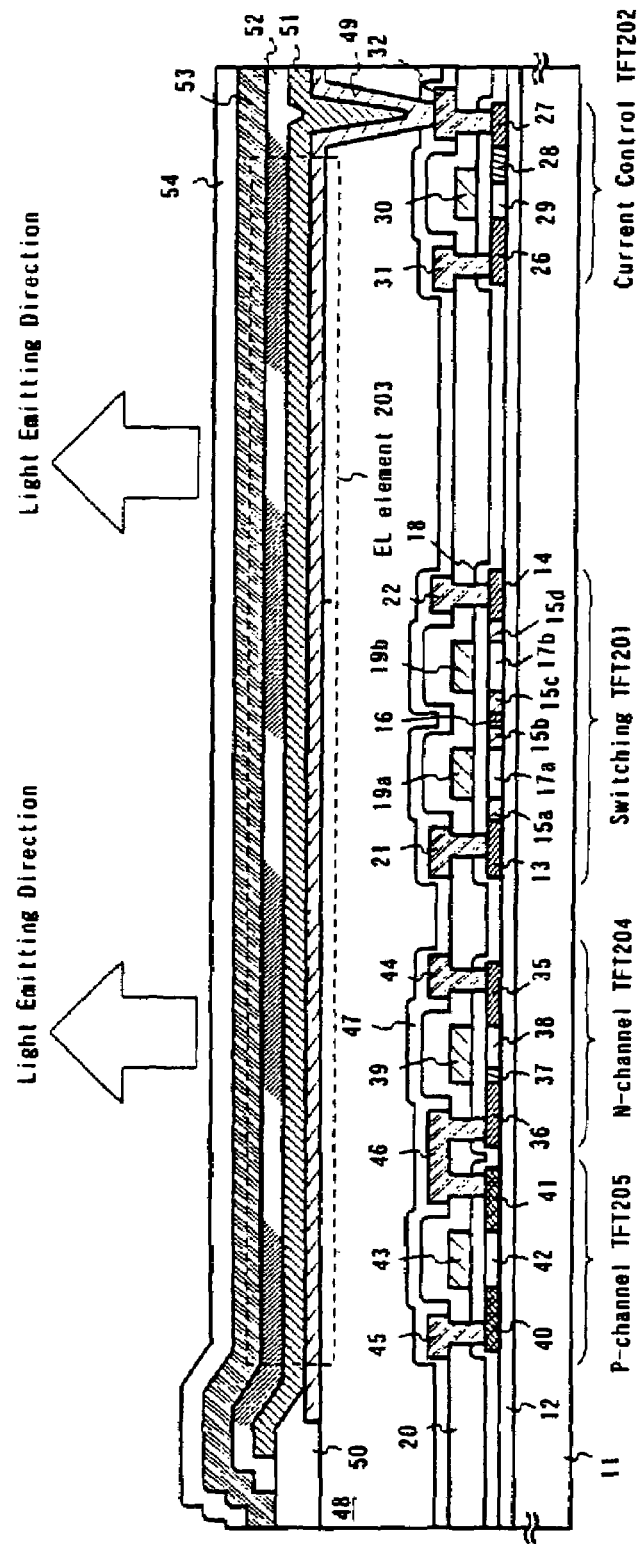
FIG. 1 is a diagram showing the cross sectional structure of an EL display device.
Figure 6A:
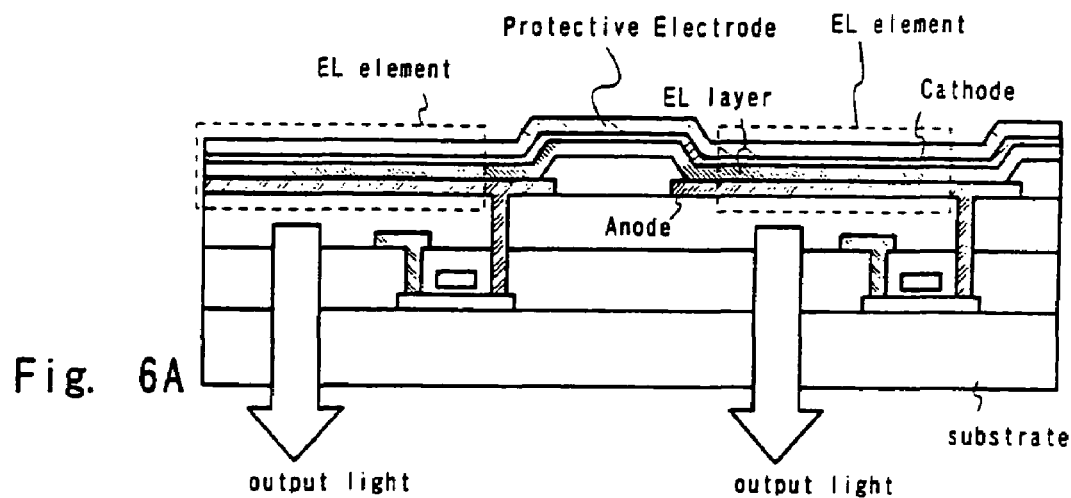
FIGS. 6A and 6B are diagrams for explaining the output direction of light from an EL display device.
Figure 6B:
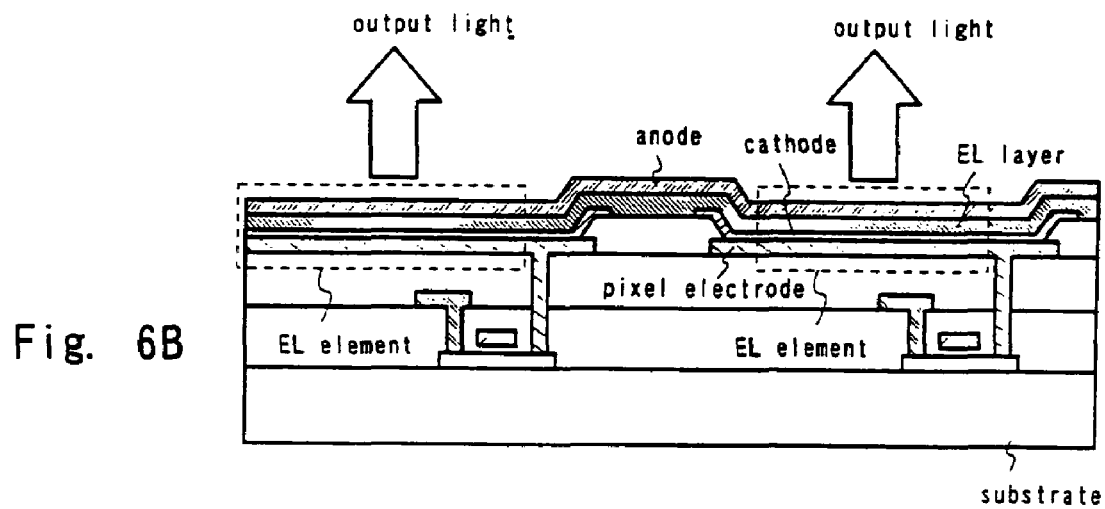

First, a schematic of the cross sectional structure of the active matrix type EL display device of the present invention is shown in FIG. 1. Reference numeral 11 denotes a substrate, and reference numeral 12 denotes an insulating film which becomes a base (hereafter referred to as a base film) in FIG. 1. A glass substrate, a quartz substrate, a crystallized glass substrate, a ceramic substrate, a silicon substrate, a metallic substrate, or a plastic substrate can be used as the substrate 11.

Further, the base film 12 is especially effective for cases in which a substrate containing mobile ions, or a substrate having conductivity, is used, but need not be formed for a quartz substrate. An insulating film containing silicon may be formed as the base film 12. Note that the term insulating film containing silicon indicates, specifically, an insulating film such as a silicon oxide film, a silicon nitride film, or an oxidized silicon nitride film (denoted by $SiO_xN_y$, where x and y are arbitrary integers) containing silicon, oxygen, and nitrogen in predetermined ratios in this specification.

Reference numeral 201 denotes a switching TFT, and reference numeral 202 denotes a current control TFT, and both are formed by an n-channel TFT. The field effect mobility of an n-channel TFT is larger than the field effect mobility of a p-channel TFT, and therefore electric current can flow at high speed, and it is easy to make a large amount of current flow in the n-channel TFT. Further, even with the same amount of current flow, the n-channel TFT can be made smaller. The dead space under a pixel electrode can therefore be more effectively utilized when the n-channel TFT is used as the current control TFT.

Note that it is not necessary to limit the switching TFT and the current control TFT to n-channel TFTs in the present invention, and that it is possible to use p-channel TFTs for either the switching TFT, the current control TFT, or both.

The switching TFT 201 is formed to have: an active layer containing a source region 13, a drain region 14, LDD regions 15a to 15d, a separating region 16, and channel forming regions 17a and 17b; a gate insulating film 18; gate electrodes 19a and 19b, a first interlayer insulating film 20, a source wiring 21, and a drain wiring 22. Note that the gate insulating film 18 or the first interlayer insulating film 20 may be made common among all TFTs on the substrate, and may also be made to differ, depending upon a circuit or an element.

The switching TFT 201 shown in FIG. 1A has the gate electrodes 19a and 19b electrically connected, forming a so-called double gate structure. Not only the double gate structure, of course, but a so-called multi-gate structure (a structure containing an active layer having two or more channel forming regions connected in series), such as a triple gate structure, may also be used.

The multi-gate structure is extremely effective in lowering the value of the off current of the TFT, and by sufficiently lowering the off current of the switching TFT, it becomes possible to use a constitution in which a capacitor (a capacitor for maintaining the gate voltage of the current control TFT) is not formed in the drain of the switching TFT. As a result, it becomes possible to even more effectively utilize the dead space within the pixel.

In addition, the LDD regions 15a to 15d in the switching TFT 201 are formed so as not to overlap with the gate electrodes 19a and 19b through the gate insulating film 18. This structure is extremely effective in reducing the off current value. Furthermore, the length (width) of the LDD regions 15a to 15d may be set from 0.5 to 3.5 µm, typically between 2.0 and 2.5 µm.

Note that the formation of an offset region (a region formed of a semiconductor layer having the same composition as the channel forming regions, and to which a gate voltage is not applied) between the channel forming regions and the LDD regions is more preferable for reducing the off current value. Further, when a multi-gate structure having two of more gate electrodes is used, the separating region 16 (a region in which the same impurity element is added, and at the same concentration, as that of the source region or the drain region) formed between the channel forming regions is effective in lowering the value of the off current.

Next, the current control TFT 202 is formed to have: an active layer containing a source region 26, a drain region 27, an LDD region 28, and a channel forming region 29; the gate insulating film 18; a gate electrode 30; the first interlayer insulating film 20; a source wiring 31; and a drain wiring 32. Note that the gate electrode 30 has a single gate structure, but a multi-gate structure may also be used.

The drain of the switching TFT 201 is electrically connected to the gate of the current control TFT 202. Specifically, the gate electrode 30 of the current control TFT 202 is electrically connected to the drain region 14 of the switching TFT 201 through the drain wiring (also referred to as a connection wiring) 22. Further, the source wiring 31 is connected to an electric current supply line for supplying a predetermined voltage.

The current control TFT 202 is an element for controlling the amount of current injected into an EL element 203, and if deterioration of the EL element is considered, then it is preferable that not too much current flows. It is preferable, therefore, to design the channel length (L), so that an excess current does not flow in the current control TFT 202. The amount of current is preferably from 0.5 to 2 µA (more preferably between 1 and 1.5 µA) per pixel.

Based on the above, when the channel length of the switching TFT is taken as L1 (where L1=L1a+L1b), and its channel width is W1, and the channel length of the current control TFT is taken as L2 and its channel width is W2, as shown in FIG. 9, it is preferable that W1 be from 0.1 to 5 μm (typically between 0.5 and 2 μm), and that W2 be from 0.5 to 10 μm (typically between 2 and 5 μm). Furthermore, it is preferable that L1 be from 0.2 to 18 μm (typically between 2 and 15 μm), and that L2 be from 1 to 50 μm (typically between 10 and 30 μm). Note that the present invention is not limited to the above numerical values.

The EL display device shown in FIG. 1 is also characterized in that the LDD region 28 is formed between the drain region 27 and the channel forming region 29 in the current control TFT 202, and in that the LDD region 28 has both a region which overlaps, and a region which does not overlap, the gate electrode 30, through the insulating film 18.

The current control TFT 202 has a relatively large amount of current flow in order to make the EL element 203 luminesce, and therefore it is preferable to take action for a countermeasure against deterioration due to hot carrier injection. Further, when black is displayed, the current control TFT 202 is set in the off state, but if the off current value is high at that time, then a clear black color display becomes impossible, and this invites problems such as a reduction in contrast. It is therefore necessary to suppress the value of the off current.

It is known that a structure in which the LDD region overlaps the gate electrode is extremely effective with regard to deterioration due to hot carrier injection. However, if the entire LDD region is made to overlap the gate electrode, then the value of the off current rises, and therefore the applicant of the present invention resolves both the hot carrier and off current value problems at the same time by adding to the above structure a novel structure in which an LDD region which does not overlap the gate electrode is formed in series.

The length of the LDD region which overlaps the gate electrode may be from 0.1 to 3 μm (preferably between 0.3 and 1.5 μm) at this point. If it is too long, then the parasitic capacitance will become large, and if it is too short, then the hot carrier prevention effect will become weakened. Further, the length of the LDD region not overlapping the gate electrode may be set from 1.0 to 3.5 μm (preferably between 1.5 and 2.0 μm). If it is too long, then a sufficient current becomes unable to flow, and if it is too short, then the off current value reduction effect becomes weakened.

A parasitic capacitance is formed in the above structure in the region where the gate electrode and the LDD region overlap, and therefore it is preferable that this region not be formed between the source region 26 and the channel forming region 29. The carrier (electrons here) flow direction is always the same for the current control TFT, and therefore it is sufficient to form the LDD region on only the drain region side.

Note that if the driving voltage (the voltage applied between the source region and the drain region) of the current control TFT 202 is equal to or less than 10 V, then hot carrier injection hardly causes a problem any longer, and therefore it is also possible to omit the LDD region 28. In that case, the active layer is comprised of the source region 26, the drain region 27, and the channel forming region 29.

Further, looking from the viewpoint of increasing the allowable amount of current flow, it is effective to make the film thickness of the active layer (especially the channel forming region) of the current control TFT 202 thick (preferably from 50 to 100 nm, more preferably between 60 and 80 nm). Conversely, looking from the point of view of making the off current value smaller for the switching TFT 201, it is effective to make the film thickness of the active layer (especially the channel forming region) thin (preferably from 20 to 50 nm, more preferably between 25 and 40 nm).

The structure of the TFT formed within the pixel is explained above. Note that a driving circuit (strictly speaking, a portion of the driving circuit) is also formed within the same pixel at the same time. A CMOS circuit, the basic unit forming the driving circuit, is shown in FIG. 1.

In FIG. 1, a TFT having a structure which reduces hot carrier injection as much as possible, with as little drop as possible in operation speed, is used as an n-channel TFT 204 of the CMOS circuit. Note that the driving circuit referred to here indicates a data signal driving circuit (including a shift register, a level shifter, a buffer, a latch, a D/A converter, and a sampling circuit), and a gate signal driving circuit (including a shift register, a level shifter, and a buffer). It is also possible to form other signal processing circuit, of course (such as a wave divider circuit, a booster circuit, a γ compensation circuit, memory, or a differential amplifier circuit).

An active layer of the n-channel TFT 204 contains a source region 35, a drain region 36, an LDD region 37, and a channel forming region 38, and the LDD region 37 overlaps a gate electrode 39, through the gate insulating film 18.

The formation of the LDD region on only the drain region side is in consideration of not lowering the operation speed. Further, it is not necessary to be concerned with the value of the off current in the n-channel TFT 204, but it is necessary to place greater emphasis on the operation speed. It is therefore preferable that the LDD region 37 completely overlap the gate electrode, reducing resistive components as much as possible. In other words, it is better to eliminate all offset.

Deterioration of a p-channel TFT 205 of the CMOS circuit due to hot carrier inject is almost of no concern, and in particular, an LDD region need not be formed. The active layer therefore contains a source region 40, a drain region 41, and a channel forming region 42, and the gate insulating film 18 and a gate electrode 43 are formed on top. It is also possible, of course, to take action against hot carriers by forming an LDD region, as in the n-channel TFT 204.

Further, the n-channel TFT 204 and the p-channel TFT 205 are each covered by the first interlayer insulating film 20, and source wirings 44 and 45 are formed. In addition, both are electrically connected by a drain wiring 46.

Next, reference numeral 47 denotes a first passivation film, and its film thickness may be set from 10 nm to 1 μm (preferably between 200 and 500 nm). An insulating film containing silicon (in particular, it is preferable to use an oxidized silicon nitride film or a silicon nitride film) can be used as the passivation film material. The passivation film 47 plays a role of protecting the formed TFTs from alkaline metals and moisture. An EL layer to be formed lastly on the TFT contains alkaline metals such as sodium. In other words, the first passivation film 47 works as a protecting layer so that these alkaline metals (mobile ions) do not penetrate into the TFT.

Further, reference numeral 48 denotes a second interlayer insulating film, which functions as a planarizing film for performing leveling of a step due to the TFTs. An organic resin film is preferable as the second interlayer insulating film 48, and one such as polyimide, polyamide, acrylic, or BCB (benzocyclobutene) may be used. These organic resin films have the advantages of easily forming a level surface which is good, and having a low specific dielectric constant. The EL layer is extremely sensitive to unevenness, and therefore it is preferable to nearly absorb the TFT step by the second interlayer insulating film. In addition, it is preferable to form the low specific dielectric constant material thickly for reducing the parasitic capacitance formed between a gate wiring or data wiring and the cathode of the EL element. The thickness, therefore, is preferably from 0.5 to 5 μm (more preferably between 1.5 and 2.5 μm).

Further, reference numeral 49 denotes a pixel electrode made from a transparent conducting film. After opening a contact hole in the second interlayer insulating film 48 and in the first passivation film 47, the pixel electrode 49 is formed so as to be connected to the drain wiring 32 of the current control TFT 202 at the opening portion. Note that if the pixel electrode 49 and the drain region 27 are not directly connected, as in FIG. 1, then even if alkaline metals in the EL layer diffuse throughout the pixel electrode the alkaline metals do not enter the active layer via the pixel electrode.

A third interlayer insulating film 50 is formed on the pixel electrode 49 from a silicon oxide film, an oxidized silicon nitride film, or an organic resin film, with a thickness from 0.3 to 1 μm. An opening portion is formed in the third interlayer insulating film 50 over the pixel electrode 49 by etching, and the edge of the opening portion is etched so as to become a tapered shape. The taper angle may be set from 10 to 60°, (preferably between 30 and 50°).

A cathode 51 is formed on the third interlayer insulating film 50. A material containing a low work function material such as magnesium (Mg), lithium (Li), or calcium (Ca), is used as the cathode 51. Preferably, an electrode made from MgAg (a material made from Mg and Ag at a mixture ratio of Mg::Ag=10::1) is used. In addition, a MgAgAl electrode, an LiAl electrode, and an LiFAl electrode can be given as other examples.

An EL layer 52 is formed on the cathode 51. It is necessary for the cathode 51 to be in a state completely covered by the EL layer 52 at this point, and the EL layer 52 is formed so as to have a larger pattern than that of the cathode 51. By doing so, short circuits between the cathode 51 and an anode formed later can be prevented.

Further, it is desirable to form the cathode 51 and the EL layer 52 in succession, without exposure to the atmosphere using a multi-chamber type (also referred to as a cluster tool type) vacuum evaporation machine. This is in order to avoid degradation of the EL layer 52 by moisture. A known technique may be used regarding the method of forming the cathode 51 and the EL layer 52.

First, for example, the cathode 51 is formed corresponding to all of the pixels by using a first mask, and next, a red light emitting EL layer is formed in the pixels corresponding to red color by using a second mask. A green light emitting EL layer and a blue light emitting EL layer may then be formed, in order, while precisely controlling the shift of the second mask. Note that the second mask may be simply shifted, as above, when the pixels corresponding to RGB are lined up in a stripe shape, but in order to realize a so-called delta arrangement pixel structure, a special third mask may be used for the green color light emitting EL layer, and a special fourth mask may be used for the blue color light emitting EL layer.

Furthermore, an example of forming a luminescing EL layer in each color by evaporation using a mask is shown in the above explanation, but an ink jet method, screen printing, and ion plating may also be used. Moreover, a rib may be formed so as to surround the pixels, dividing each color of EL layer.

In addition, an example of performing color display using the three colors of red, green, and blue is shown in the above explanation, but provided that an EL display device displaying single color luminescence is made, an EL layer emitting light of any of red, green, or blue may be formed over the entire surface. It is also possible, of course, to form a white color light emitting EL layer to make a monochrome display EL display device.

A single layer structure or a lamination structure can be used for the EL layer 51, but it is preferable to use the lamination structure because it has good light emitting efficiency. In general, a hole injecting layer, a hole transporting layer, a light emitting layer, and an electron transporting layer are formed in order on the pixel electrode, but a structure having a hole transporting layer, a light emitting layer, and an electron transporting layer, or a structure having a hole injecting layer, a hole transporting layer, a light emitting layer, an electron transporting layer, and an electron injecting layer may also be used. Any known structure may be used by the present invention, and doping of a fluorescent pigment into the EL layer may also be performed.

The materials disclosed in the following U.S. Patents and Japanese patent applications which are laid open, for example, can be used as an organic EL material: U.S. Pat. Nos. 4,356,429; 4,539,507; 4,720,432; 4,769,292; 4,885,211; 4,950,950; 5,059,861; 5,047,687; 5,073,446; 5,059,862; 5,061,617; 5,151,629; 5,294,869; 5,294,870; Japanese Patent Application Laid-open No. Hei 10-189525; Japanese Patent Application Laid-open No. Hei 8-241048; and Japanese Patent Application Laid-open No. Hei 8-78159.

Specifically, a material such as the one represented by the following general formula can be used as a hole injecting layer.

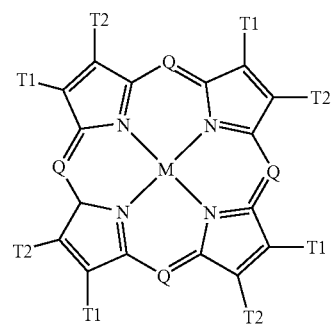

[Chem 1]

where Q is either N or a C—R (carbon chain); M is a metal, a metal oxide compound, or a metal halogen compound: R is hydrogen, an alkyl, an aralkyl, an allyl, or an alkalyl; and T1 and T2 are unsaturated six member rings containing substituents such as hydrogen, alkyls, or halogens.

Furthermore, an aromatic tertiary amine can be used as an organic material serving as the hole transporting layer, preferably containing the tetra-allyl-diamine represented by the following general formula.

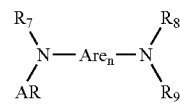

[Chem 2]

where Are is an allylene group, n is an integer from 1 to 4, and AR, $R_7$, $R_8$, and $R_9$ are each a chosen allyl group.

In addition, a metal oxynoid compound can be used as an organic material for the EL layer, the electron transporting layer, or electron injecting layer. A material such as that expressed by the general formula below may be used as the metal oxynoid compound.

[Chem 3]

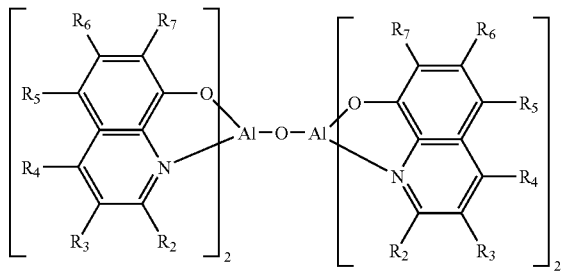

where $R_2$ through $R_7$ may be substituted, and a metal oxynoid compound, below, can also be used.

[Chem 4]

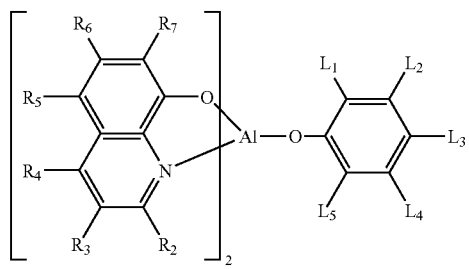

where $R_2$ through $R_7$ are defined as stated above; $L_1$ through $L_5$ are carbohydrate groups containing from 1 to 12 carbon atoms; and both $L_1$ and $L_2$, or both $L_2$ and $L_3$ can form benzo-rings. Further, a metal oxynoid compound, below, may also be used.

[Chem 5]

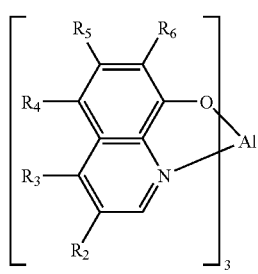

where $R_2$ through $R_6$ may be substituted. Coordination compounds having organic ligands are thus included as organic EL element materials. Note that the above are merely some examples of organic EL materials which can be used as the EL material of the present invention, and that there is absolutely no need to limit the EL material to these.

Furthermore, a polymer material may be used as the EL material. Polymers such as the following can be given as typical polymer materials: polyparaphenylene vinylenes (PPVs); and polyfluorenes. For colorization, it is preferable to use, for example, a cyano-polyphenylene vinylene in a red light emitting material; a polyphenylene vinylene in a green light emitting material; and a polyphenylene vinylene or a polyalkylphenylene in a blue light emitting material.

Note that EL display devices are roughly divided into four types of color display methods: a method of forming three types of EL elements corresponding to R (red), G (green), and B (blue); a method of combining white color luminescing EL elements with color filters; a method of combining blue or blue-green luminescing EL elements and fluorescent matter (fluorescent color change layer, CCM); and a method of using a transparent electrode as a cathode (opposing electrode) and overlapping EL elements corresponding to R, G, and B.

The structure of FIG. 1 is an example of the case where the method of forming three types of EL elements corresponding to R, G, and B is employed. Note that although only one pixel is shown in FIG. 1, pixels having an identical structure are formed corresponding to red, green and blue colors, respectively, and that color display can thus be performed. However, it is possible to implement the present invention without regard to the method of luminescence, and all of the above four methods can be used in the present invention.

After thus forming up through the EL layer 52, an anode 53 made from a transparent conducting film (oxide conducting film) is formed on the EL layer 52. The film thickness may be set from 80 to 300 nm (preferably between 100 and 200 nm). The light emitted in the EL layer is output in the upper direction of FIG. 1 (the direction opposite that of the substrate) in the case of the present invention, and therefore the anode 53 must be transparent with respect to the light emitted from the EL layer 52.

Note that a luminescing element comprised of the cathode 51 (or a cathode which includes the pixel electrode 49, as well as the cathode 51), the EL layer 52, and the anode 53 is referred to as the EL element throughout this specification. The EL element is denoted by reference numeral 203 in FIG. 1.

Reference numeral 54 denotes a second passivation film, and its film thickness may be set from 10 nm to 1 μm (preferably between 200 and 500 nm). The object of forming the second passivation film 54 is mainly to protect the EL layer 52 from moisture, but it is also effective if the second passivation film 54 is made to possess a heat radiation effect. Note that the EL layer is weak with respect to heat, as stated above, and therefore it is preferable to perform film deposition at as low a temperature as possible (preferably in the range from room temperature to 120° C.). It can therefore be said that plasma CVD, sputtering, vacuum evaporation, ion plating, and solution application (spin coating) are desirable film deposition methods.

The pixel portion with a structure like that shown in FIG. 1 is thus completed. In the pixel portion of the present invention, CMOS circuits comprised of the n-channel TFT 204 and the p-channel TFT 205 is formed under the pixel electrode 49, and with this CMOS circuit as a basic unit, various elements, driving circuits, and a signal processing portion are formed. Note that FIG. 1 does not mean that one CMOS circuit is formed in one pixel, but rather means that circuits conventionally formed in the periphery of a pixel portion, such as the driving circuit, are formed within the pixel portion.

The elements, driving circuits, and the signal processing portion conventionally formed in the periphery of the pixel portion are formed using TFTs formed under the pixel electrode in each pixel. On the whole, they are formed in the interior of the pixel portion (inside the pixel portion).

Note that the main point of the present invention is the effective utilization of substrate surface area by arranging circuits or elements, conventionally formed in the periphery of the pixel portion, in the dead space within the pixel portion (under the pixel electrode) in an EL display device which outputs light opposite to the substrate. The present invention, therefore, is not limited to the TFT structure of FIG. 1.

Embodiment 1

The preferred embodiments of the present invention will be explained using FIGS. 2A to 5C. A method of manufacturing the pixel portion shown in FIG. 1 is explained here. Note that a CMOS circuit is shown in the figures as a basic unit for a driving circuit in order to simplify the explanation.

First, as shown in FIG. 2A, a substrate 501, on the surface of which a base film (not shown in the figures) is formed, is prepared. A 100 nm thick silicon nitride oxide film and a 200 nm thick silicon nitride oxide film are laminated and used as the base film on crystalized glass in embodiment 1. At this point it is appropriate to set the nitrogen concentration of the film contacting the crystalized glass substrate to between 10 and 25 wt %. Elements may also, of course, be formed directly on top of a quartz substrate without forming the base film.

Next, an amorphous silicon film 502 with a thickness of 45 nm is formed on the substrate 501 by a known film deposition method. Note that it is not necessary to limit this to the amorphous silicon film, and any other film, provided that it is a semiconductor film having an amorphous structure (including a microcrystalline semiconductor film) may also be used. In addition, a compound semiconductor film containing an amorphous structure, such as an amorphous silicon germanium film, may also be used.

Japanese Patent Application Laid-open No. Hei 10-247735, by the assignee of the present invention, can be wholly cited for processes from here through those of FIG. 2C. In the above patent application, a technique related to a method of crystallizing a semiconductor film by using an element such as Ni as a catalyst is disclosed.

First, a protecting film 504 having opening portions 503a and 503b is formed. A 150 nm thick silicon oxide film is used in embodiment 1. A layer containing nickel (Ni) 505 (Ni containing layer) is then formed on the protecting film 504 by spin coating. The above patent application may be referred to regarding the formation of the Ni containing layer.

Next, as shown in FIG. 2B, the amorphous silicon film 502 is crystallized by heat treatment for 14 hours at 570° C. in an inert atmosphere. Crystallization proceeds roughly parallel to the substrate with regions in contact with Ni (hereafter referred to as Ni added regions) 506a and 506b as origins, forming a polysilicon film 507 having a crystal structure in which rode shaped crystals are lined up together.

An element residing in periodic table group 15 (preferably phosphorous) is then added to the Ni added regions 506a and 506b with the protecting film 505 left in place as a mask, as shown in FIG. 2C. Regions in which a high concentration of phosphorous is added (hereafter referred to as phosphorous added regions) 508a and 508b are thus formed.

Next, as shown in FIG. 2C, heat treatment is added for 12 hours at 600° C. in an inert atmosphere. The Ni which exists in the polysilicon film 507 migrates due to the heat treatment, and finally, is nearly completely captured in the phosphorous added regions 508a and 508b, as shown by the arrows. This can be considered to be a phenomenon of a gettering effect of the metallic element (Ni in embodiment 1) by phosphorous.

The concentration of Ni remaining in the polysilicon film 509 by this process is reduced at least to $2 \times 10^{17}$ atoms/cm$^3$, as measured by SIMS (secondary ion mass spectroscopy). Ni is a lifetime killer for the semiconductor, and if the concentration of Ni is reduced to this level, then there is no harmful influence imparted to the characteristics of a TFT. Further, this concentration is nearly at the limit of measurability by present-day SIMS, and therefore it is anticipated that there is an even lower actual concentration (less than $2 \times 10^{17}$ atoms/cm$^3$).

The polysilicon film 509, crystallized by using a catalyst, and in which the catalyst is then reduced to a level at which it does not cause damage to the TFT, is thus obtained. Active layers 510 to 513 using the polysilicon film 509 are formed afterward by patterning. Note that a marker for performing mask alignment during later patterning may be formed at this time using the above polysilicon film. (See FIG. 2D.)

A 50 nm thick silicon nitride oxide film is formed next by plasma CVD, as shown in FIG. 2E, and moreover, a thermal oxidation step is performed by heat treatment for 1 hour at 950° C. in an oxidizing atmosphere. Note that the oxidizing environment may be an oxygen atmosphere, or an oxygen atmosphere in which a halogen element is added.

Oxidation proceeds in the interface of the active layers and the above silicon nitride oxide film by the above thermal oxidation step, and an approximately 15 nm thickness of the polysilicon film is oxidized, forming an approximately 30 nm thick silicon oxide film. In other words, a gate insulating film 514 with a thickness of 80 nm is formed from a lamination of the 30 nm thick silicon oxide film and the 50 nm thick silicon nitride oxide film.

A resist mask 515 is formed next, as shown in FIG. 3A, and an impurity element which imparts p-type conductivity (hereafter referred to as a p-type impurity element) is added through the gate insulating film 514. An element residing in periodic table group 13, typically boron or gallium, can be used as the p-type impurity element. This process is (referred to as a channel doping process) is a process for controlling the threshold voltage of the TFT.

Note that boron is added in embodiment 1 by plasma excited ion doping, without separation of mass, of diborane ($B_2H_6$). Ion implantation, which performs separation of mass, may of course also be used. Impurity regions 516 to 518, containing boron at a concentration of $1 \times 10^{15}$ to $1 \times 10^{18}$ atoms/cm$^3$ (typically between $5 \times 10^{16}$ and $5 \times 10^{17}$ atoms/cm$^3$), are formed by this process.

Resist masks 519a and 519b are formed next, as shown in FIG. 3B, and an impurity element which imparts n-type conductivity (hereafter referred to as an n-type impurity element) is added, through the gate insulating film 514. An element residing in periodic table group 15, typically phosphorous or arsenic, can be used as the n-type impurity element. Note that phosphorous is added at a concentration of $1 \times 10^{18}$ atoms/cm$^3$ in embodiment 1 by plasma excited plasma doping, without separation of mass, of phosphine ($PH_3$). Ion implantation, which performs separation of mass, may also be used, of course.

The dosage is regulated so that the n-type impurity element is contained in n-type impurity regions 520 and 521 formed as above at a concentration of $2 \times 10^{16}$ to $5 \times 10^{19}$ atoms/cm$^3$ (typically between $5 \times 10^{17}$ and $5 \times 10^{18}$ atoms/cm$^3$).

A process of activating the added n-type impurity elements and p-type impurity elements is then performed, as shown in FIG. 3C. It is not necessary to place any limitations on the means of activation, but a furnace annealing process is preferable because the gate insulating film 514 has been formed. Further, there is a possibility of damage being imparted to the interface of the active layers and the gate insulating film of the portion which becomes a channel forming region in the process of FIG. 3A, and therefore it is preferable to perform heat treatment at as high a temperature as possible.

Crystallized glass having a high resistance to heat is used in embodiment 1, and therefore the activation process is performed by furnace annealing at 800° C. for 1 hour. Note that thermal oxidation may be performed by making the process environment into an oxidizing atmosphere, and that heat treatment may be performed by using an inert atmosphere.

The edge portions of the n-type impurity regions 520 and 521, namely, the boundary (junction portion) with a region in the periphery of the n-type impurity regions 520 and 521 in which the n-type impurity element is not added (the p-type impurity region formed by the process of FIG. 3A) are defined by the above process. This means that an extremely good junction portion between an LDD region and the channel forming region can be formed at the point when the TFT is later completed.

A 200 to 400 nm thick conducting film is formed next and patterned, forming gate electrodes 522 to 525. Note that a single layer electrode film may be formed for the gate electrode, but when necessary, it is preferable to use a two layer or a three layer lamination film. A known conducting film can be used as the gate electrode material. (See FIG. 3D.)

Specifically, a film of an element chosen from among the group consisting of tantalum (Ta), titanium (Ti), molybdenum (Mo), tungsten (W), chromium (Cr), and conducting silicon (Si); or a film of a nitrated compound of the above elements (typically a tantalum nitride film, a tungsten nitride film, or a titanium nitride film); or an alloy film of a combination of the above elements (typically a Mo-W alloy or a Mo-Ta alloy); or a silicide film of the above elements (typically a tungsten suicide film or a titanium silicide film) can be used. A single layer film or a lamination may be used, of course.

A lamination film made from a 50 nm thick tungsten nitride (WN) film and a 350 nm thick tungsten (W) film is used in embodiment 1. This film may be formed by sputtering. Furthermore, if an inert gas such as Xe or Ne is added as a sputtering gas, then film peeling due to stress can be prevented.

The gate electrodes 523 and 525 are formed at this time so as to overlap portions of the n-type impurity regions 520 and 521, respectively, with the gate insulating film 514 interposed therebetween. The overlapping portions later become LDD regions overlapping the gate electrode. Note that two gate electrodes 524 can be seen in cross section, but they are actually connected electrically.

Next, an n-type impurity element (phosphorous is used in embodiment 1) is added in a self-aligning manner with the gate electrodes 522 to 525 as masks, as shown in FIG. 4A. The addition is regulated so that phosphorous is added to impurity regions 526 to 532 thus formed at a concentration of $1/10$ to $1/2$ (typically between $1/4$ and $1/3$) that of the impurity regions 520 and 521. Specifically, a concentration of $1 \times 10^{16}$ to $5 \times 10^{18}$ atoms/cm$^3$ (typically between $3 \times 10^{17}$ and $3 \times 10^{18}$ atoms/cm$^3$) is preferable.

Resist masks 533a to 533d are formed next, in a shape so as to cover the gate electrodes, as shown in FIG. 4B, and an n-type impurity element (phosphorous is used in embodiment 1) is added, forming impurity regions 534 to 540 containing a high concentration of phosphorous. Ion doping using phosphine (PH$_3$) is also performed here, and the phosphorous concentration of these regions is regulated to be from $1 \times 10^{20}$ to $1 \times 10^{21}$ atoms/cm$^3$ (typically between $2 \times 10^{20}$ and $5 \times 10^{20}$ atoms/cm$^3$).

A source region or a drain region of the n-channel TFT is formed by this process, and in the switching TFT, a portion of the n-type impurity regions 529 to 531 formed by the process of FIG. 4A remains. These remaining regions correspond to the LDD regions 15a to 15d of the switching TFT in FIG. 1.

Next, as shown in FIG. 4C, the resist masks 533a to 533d are removed, and a new resist mask 541 is formed. A p-type impurity element (boron is used in embodiment 1) is then added, forming impurity regions 542 and 543 containing a high concentration of boron. Boron is added here to a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane (B$_2$H$_6$).

Note that phosphorous has already been added to the impurity regions 542 and 543 at a concentration of $1 \times 10^{16}$ to $5 \times 10^{18}$ atoms/cm$^3$, but boron is added here at a concentration of at least 3 times that of the phosphorous. Therefore, the n-type impurity regions already formed completely invert to p-type, and function as p-type impurity regions.

Next, after removing the resist mask 541, as shown in FIG. 4D, a first interlayer insulating film 544 is formed. A single layer insulating film containing silicon is used as the first interlayer insulating film, but a lamination film of the same may also be used. Further, a film thickness of between 400 nm and 1.5 μm is appropriate. A lamination structure of an 800 nm thick silicon oxide film on a 200 nm thick silicon nitride oxide film is used in embodiment 1.

The p-type impurity elements and the n-type impurity elements, added at their respective concentrations, are activated afterward. Furnace annealing is preferable as a means of activation. Heat treatment is performed using an electric furnace for 4 hours at 550° C. in an inert atmosphere in embodiment 1.

In addition, heat treatment is also performed for 1 to 12 hours at 300 to 450° C. in an atmosphere containing between 3 and 100% hydrogen, performing hydrogenation. This process is one of hydrogen termination of dangling bonds in the semiconductor film by hydrogen which has been thermally excited. Plasma hydrogenation (using hydrogen excited by a plasma) may also be performed as another means of hydrogenation.

Note that the hydrogenation step may also be conducted during the formation of the first interlayer insulating film 544. Namely, hydrogen processing may be performed as above after forming the 200 nm thick silicon nitride oxide film, and then the remaining 800 nm thick silicon oxide film may be formed.

A contact hole is formed next in the first interlayer insulating film 544, and source wirings 545 to 548, and drain wirings 549 to 551 are formed. In embodiment 1, a lamination film with a three layer structure of a 100 nm titanium film, a 300 nm aluminum film containing titanium, and a 150 nm titanium film, formed successively by sputtering, is used as the electrodes. Other conducting films may also be used, of course.

A first passivation film 552 is formed next with a thickness of 50 to 500 nm (typically between 200 and 300 nm).

A 306 nm thick oxidized silicon nitride film is used as the first passivation film 344 in embodiment 1. A silicon nitride film may also be substitute for the silicon nitride oxide film.

It is effective to perform plasma processing at this point using a gas containing hydrogen, such as $H_2$ or $NH_3$, before the formation of the silicon nitride oxide film. Hydrogen excited by this preprocess is supplied to the first interlayer insulating film 544, and the film quality of the first passivation film 552 is improved by performing heat treatment. At the same time, the hydrogen added to the first interlayer insulating film 544 diffuses to the lower side, and the active layers can be effectively hydrogenated.

A second interlayer insulating film 553 is formed next, as shown in FIG. 5B, out of an organic resin. Materials such as polyimide, acrylic, and BCB (benzocyclobutane) can be used as the organic resin. In particular, it is necessary for the second interlayer insulating film 553 to level the step formed by the TFTs, and therefore it is preferable to use an acrylic film having superior leveling characteristics. A 2.5 µm thick acrylic film is formed in embodiment 1.

A contact hole for reaching the drain wiring 551 is formed next in the second interlayer insulating film 553 and in the first passivation film 552, and a pixel electrode 554 is formed. A 200 nm thick aluminum alloy film (an aluminum film containing 1 wt % titanium) is formed as the pixel electrode in embodiment 1.

A 500 nm thick insulating film containing silicon (a silicon oxide film in embodiment 1) is formed next, and an opening portion is formed at the position corresponding to the pixel electrode 554, forming a third interlayer insulating film 555. By using wet etching when forming the opening portion, a sidewall having a tapered shape can easily be made. If the sidewall of the opening portion is not sufficiently gentle, then degradation of an EL layer due to the step becomes a conspicuous problem.

A cathode (MgAg electrode) 556 and an EL layer 557 are formed next in succession, without exposure to the atmosphere, using vacuum evaporation. The film thickness of the cathode 556 may be set from 180 to 300 nm (typically between 200 and 250 nm), and the thickness of the EL layer 557 may be set from 80 to 200 nm (typically between 100 and 120 nm).

In this step, first, the cathodes 556 is formed for the pixel corresponding to the color red, the pixel corresponding to the color green, and the pixel corresponding to the color blue, in order. If the cathodes 556 are patterned at this point, then there must be exposure to the atmosphere and the EL layer formed next cannot be formed in succession. It is preferable, therefore, to physically pattern the cathodes 556 at the time of deposition by vacuum evaporation using something such as a metal mask.

The EL layers 557 which emit the respective colors are then formed by vacuum evaporation so as to cover the cathodes 556 formed in each pixel. Note that the EL layer has little resistance with respect to a solution, and therefore the EL layer for each color must be formed individually without using a photolithography technique. A metal mask or the like is then used to cover regions except for those of the desired pixels, and the EL layer is selectively formed.

In other words, a mask is set to cover all of the regions except for the pixels corresponding to the color red, and the red color emitting EL layers and the cathodes are formed selectively using the mask. Next, a mask is set to cover all of the regions except for the pixels corresponding to the color green, and the green color emitting EL layers and the cathodes are formed selectively using the mask. A mask is next similarly set to cover all of the regions except for the pixels corresponding to the color blue, and the blue color emitting EL layers and the cathodes are formed selectively using the mask. Note that it is recorded here that all of the masks used are different, but the same mask may also be reused.

If a method of formation so as to perform patterning at the time of deposition using vacuum evaporation is used as shown in embodiment 1, it becomes possible to form the cathodes 556 and the EL layers 557 in succession without exposure to the atmosphere, and the emission efficiency of the EL element can be increased.

Note that a known material can be used as the EL layer 557. Considering the driving voltage, it is preferable to use an organic material as the known material. For example, a 4 layer structure made from a hole injecting layer, a hole transporting layer, an emitting layer, and an electron injecting layer may be used as the EL layer. Further, an example is shown of an MgAg electrode being used as the cathode of the EL element in embodiment 1, but another known material may also be used.

An anode 558 made from a transparent conducting film is formed next, covering the EL layer 557. A 110 nm thick indium tin oxide (ITO) film is formed in embodiment 1, and patterning is performed, forming the anode. Furthermore, a transparent conducting film in which between 2 and 20% zinc oxide (ZnO) is mixed into indium oxide, or a tin oxide film, may also be used.

Finally, a second passivation film 559 made from a silicon nitride film is formed with a thickness of 300 nm. The EL layer 557 is protected from things such as moisture by the second passivation film 559. Further, the second passivation film 559 also fulfills a role of releasing heat generated by the EL layer 557.

An active matrix type EL display device having a structure as shown in FIG. 5C is thus completed. Note that the manufacturing processes of embodiment 1 are only one example. For example, although the semiconductor film which becomes the active layer in embodiment 1 may be formed by the means recorded in Japanese Patent Application Laid-open No. Hei 10-247735, other known means may also be used. The entire disclosure of this laid-open patent is incorporated herein by reference.

Furthermore, the arrangement of the LDD region or the like shows only one preferred example, and it is not necessary to limit the structure to this arrangement of embodiment 1. Note that the structure of embodiment 1, in cases of using a polysilicon film as the active layer, is preferable in that the reliability is increased, and the advantages of using the polysilicon film as the active layer are made full use of.

Embodiment 2

After completing through FIG. 5C in accordance with embodiment 1, in addition, it is preferable to perform packaging (sealing) by using a housing material such as a highly airtight protecting film (such as a laminar film or an ultraviolet hardened resin film) or a ceramic sealing can, so that there is no exposure to the atmosphere. By making the inside of the housing material an inert environment, and by placing a drying agent (for example, barium oxide) within the housing material, the reliability (life) of the EL layer is increased at this time.

Furthermore, after the airtightness is increased by the packing processing, a connector (a flexible printed circuit, FPC) for connecting between output terminals from elements or circuits formed on the substrate, and external input terminals, is attached, completing a manufactured product.

The EL display device in this state of being able to be shipped is referred to as an EL module throughout this specification.

Figure 7A:
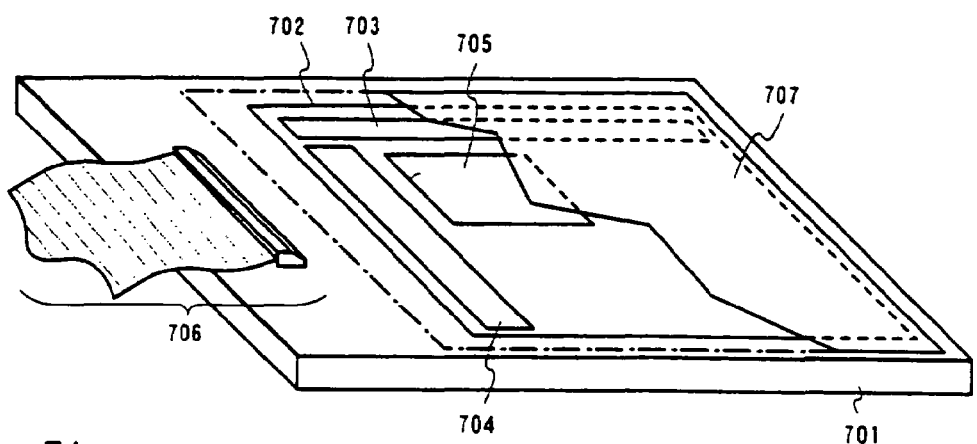
FIGS. 7A and 7B are diagrams showing the external appearance of an EL module.
Figure 7B:
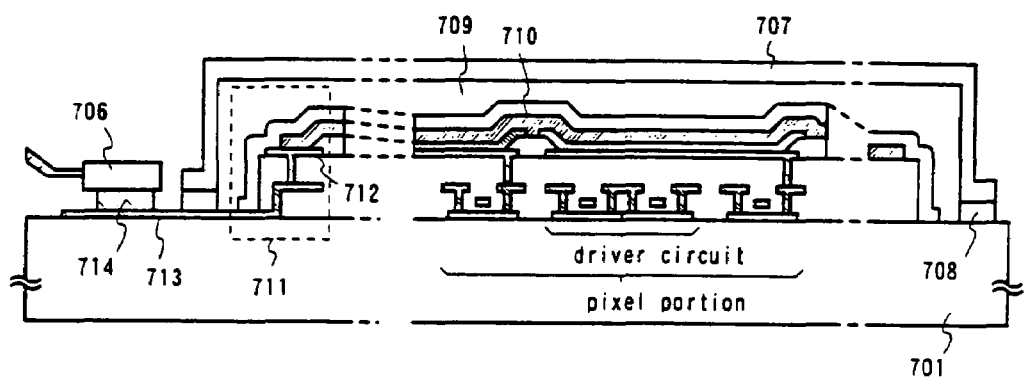

The constitution of the EL module is explained here using FIGS. 7A and 7B. A pixel portion 702, a gate signal side driving circuit 703, a data signal side driving circuit 704, and a signal processing portion (a circuit group of circuits other than driving circuits, such as a wave divider circuit and a booster circuit) 705 are formed on a substrate 701. The gate signal side driving circuit 703, the date signal side driving circuit 704, and the signal processing portion 705 are formed on the interior (inside) of the pixel portion with the present invention. Further, although not shown in the figures, various wirings from the respective driving circuits and the signal processing portion are connected to external equipment, via an FPC 706.

A housing material 707 is formed at this point enclosing the pixel portion. Note that the housing material 707 is of a shape having a large irregularity in which the internal dimension (depth) is larger than the external dimension (height) of the pixel portion 702, or has a sheet shape, and is formed by a transparent material.

Further, the housing material 707 is fixed to the substrate 701 by an adhesive 708 so as to form an airtight space 709 jointly with the substrate 701, as shown in FIG. 7B. At this point, the EL element is in a state of being completely sealed in the above airtight space, and is completely cut off from the external atmosphere. Note that a multiple number of housing materials 707 may be formed.

It is preferable to use an insulating substance such as a glass or a polymer as the housing material 707. The following can be given as examples: amorphous glass (such as borosilicate glass or quartz); crystallized glass; ceramic glass; organic resins (such as acrylic resins, styrene resins, polycarbonate resins, and epoxy resins); and silicon resins.

It is possible to use an adhesive such as an epoxy resin or an acrylic resin as the material of the adhesive 708. In addition, a thermally hardened resin or a light hardened resin can also be used as the adhesive. Note that it is necessary to use a material through which, as much as is possible, oxygen and moisture is not transmitted.

In addition, it is preferable to fill the space 709 between the housing material 707 and the substrate 701 with an inert gas (such as argon, helium, or nitrogen). There are no limitations on a gas, and it is also possible to use an inert liquid (such as a liquid fluorinated carbon, typically parafluoroalkaline). The materials such as those taught in Japanese Patent Application Laid-open No. Hei 8-78519 may be referred to regarding inert liquids.

It is effective to form drying agent in the space 709. Materials such as those recorded in Japanese Patent Application Laid-open No. Hei 9-148066 can be used as the drying agent. Typically, barium oxide may be used.

A multiple number of isolated pixels having EL elements are formed in the pixel portion, and all of the pixels have an anode 710 as a common electrode. The anode 710 is connected to an input-output wiring 713, through a connection wiring 712 made from the same material as the pixel electrode, in a region shown by reference numeral 711. The input-output wiring 713 is a wiring for imparting a predetermined voltage to the anode 710, and is connected to the FPC 706 through a conducting paste 714.

The manufacturing processes for realizing a contact structure in the region 711 are explained here using FIGS. 8A to 8C.

First, the state of FIG. 5A is obtained in accordance with the processes of embodiment 1. The first interlayer insulating film 544 and the gate insulating film 514 are removed in a contact portion in the edge portion of the substrate (the region shown by reference numeral 711 in FIG. 7B) at this point, and the input-output wiring 713 is formed. This may, of course, be formed at the same time as the source wiring and the drain wiring of FIG. 5A. (See FIG. 8A.)

The second interlayer insulating film 553 and the first passivation film 552 are etched next in FIG. 5B, removing a region denoted by reference numeral 801, and an opening portion 802 is formed. The connection wiring 712 is then formed so as to cover the opening portion 802. The connection wiring 712 may, of course, be formed at the same time as the pixel electrode 554 in FIG. 5B. (See FIG. 8B.)

The EL element formation processes (the processes of forming the third interlayer insulating film, the cathode, and the EL layer) is performed in the pixel portion in this state. The third interlayer insulating film and the EL element are not formed using a mask or the like in the region shown in FIGS. 8A to 8C at this point. After forming the EL layer 557, the anode 558 is formed using a separate mas. The anode 558 and the input-output wiring 713 are thus electrically connected through the connection wiring 712. In addition, the second passivation film 559 is formed, obtaining the state of FIG. 8C.

The contact structure is thus realized in the region shown by reference numeral 711 of FIG. 7B. The input-output wiring 713 is then connected to the FPC 706 through the space between the housing material 707 and the substrate 701 (note that this is filled by the adhesive 708; namely, it is necessary for the adhesive 708 to have a thickness which can sufficiently level the step in the input-output wiring). The portion in which the adhesive 708 is formed is pressed between the housing material 707 and the substrate 701, and therefore if an element or a circuit exists there, then there is a possibility of it being destroyed, but provided that only a wiring is passing through, as in FIG. 7B, there is no problem.

Note that the method of manufacturing the active matrix type EL display device shown in embodiment 2 may be performed in accordance with embodiment 1.

Embodiment 3

Figure 10:
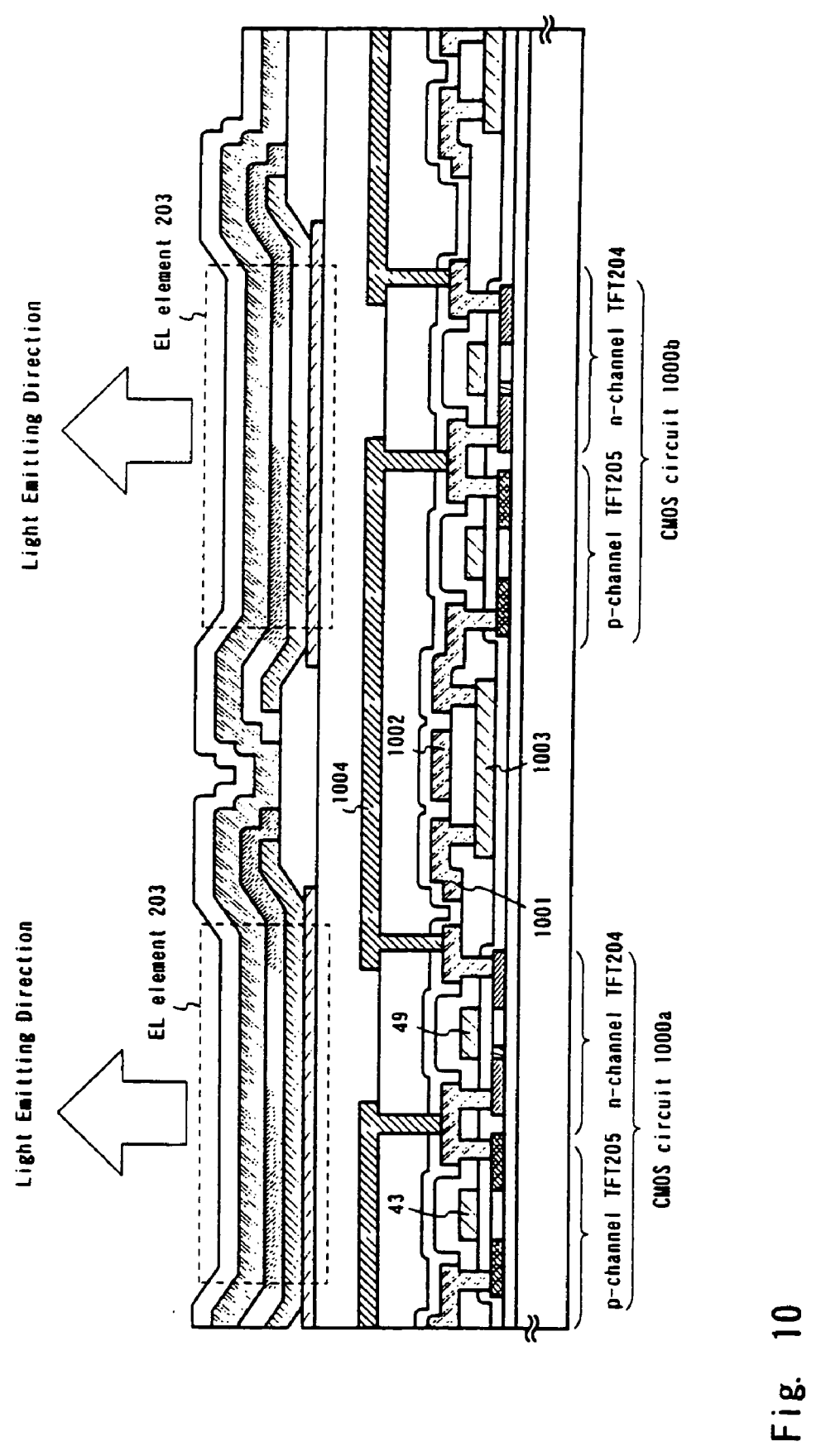

The cross sectional structure of the pixel portion of the active matrix type EL display device of the present invention is explained in embodiment 3 using FIG. 10. Note that, in FIG. 10, portions which are identical to those of FIG. 1 cite the same symbols as FIG. 1.

In FIG. 10, reference numeral 1001 denotes a current supply line, which is connected to a source region of a current control TFT (not shown in the figure). Further, reference numeral 1002 denotes a data wiring, which is connected to a source region of a switching TFT (not shown in the figure).

The current supply line 1001 and the data wiring 1002 exist between adjoining pixels arranged in a direction parallel to a gate wiring. Therefore, wirings for mutually connecting driving circuit TFTs (TFT forming a portion of the driving circuit) formed in differing pixels have to cross the current supply line 1001 and the data wiring 1002.

In this case, methods such as those shown in embodiment 3 can be given. The first is a method of forming a first connecting wiring 1003 at the same time as the gate electrodes 39 and 43, and making the first connecting wiring 1003 passing under the wirings such as a data line. This method is used in embodiment 3 to connect the current supply line 1001 and a CMOS circuit 1000b.

Further, the second is a method of forming a second connecting wiring 1004, which crosses the current supply line 1001 and/or the data wiring 1002. This method is used to connect a CMOS circuit 1000*a* and the CMOS circuit 1000*b* in embodiment 3.

In this case, after opening a contact hole in the second interlayer insulating film 553, the second connecting wiring 1004, not the pixel electrode, may be formed in the processes of FIG. 5B. An interlayer insulating film is then formed next, covering the second connecting wiring 1004, a contact hole is opened, and the pixel electrode may be formed.

Note that the current supply line 1001 and the data wiring 1002 are formed on the same layer in embodiment 3, but they also may be formed on separate layers. Namely, the current supply line 1001 or the data wiring 1002 may be formed in the layer of the second connecting wiring 1004 of FIG. 10. In that instance, the second connecting wiring may be formed on the same layer as the gate wiring, going over the current supply line and the data wiring.

Embodiment 3 is thus characterized in that the connecting wiring formed in a different layer from that of the current supply line and the data wiring is used, and that the current supply line and the data wiring cross over in accordance with such. The same wiring as the gate wiring, or a wiring formed in a layer between the data wiring and the pixel electrode can be used as the connecting wiring of embodiment 3.

Note that the structure of embodiment 3 can be easily manufactured by referring to embodiment 1. Further, it is possible to implement the constitution of embodiment 3 in combination with the EL display device shown in embodiment 2.

Embodiment 4

An example of a case of using the constitution of embodiment 3 and forming a driving circuit inside a pixel is explained in embodiment 4. Specifically, an example of forming a shift register in the inside (interior) of a pixel portion is shown.

Figure 11A:
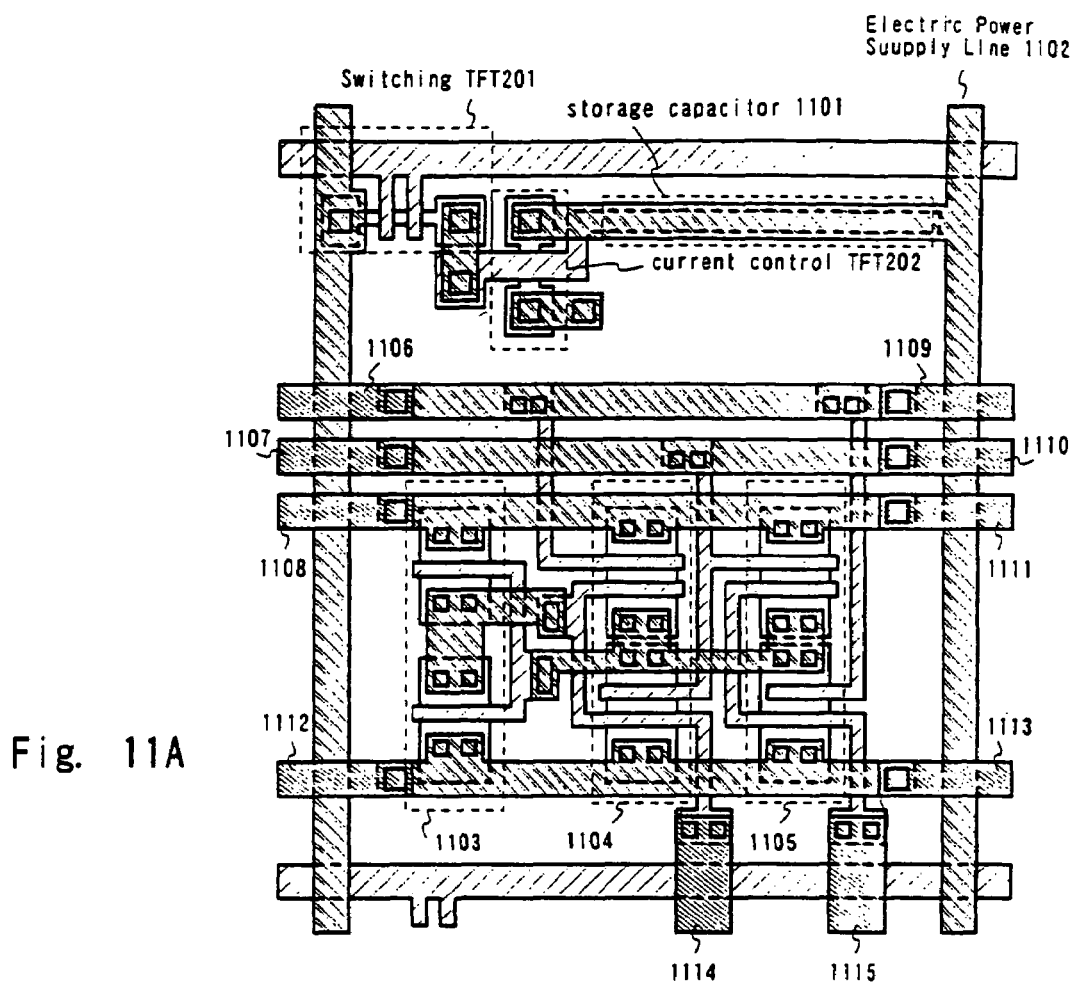
FIGS. 11A and 11B are diagrams showing the top structure of a pixel portion of an EL display device.
Figure 11B:
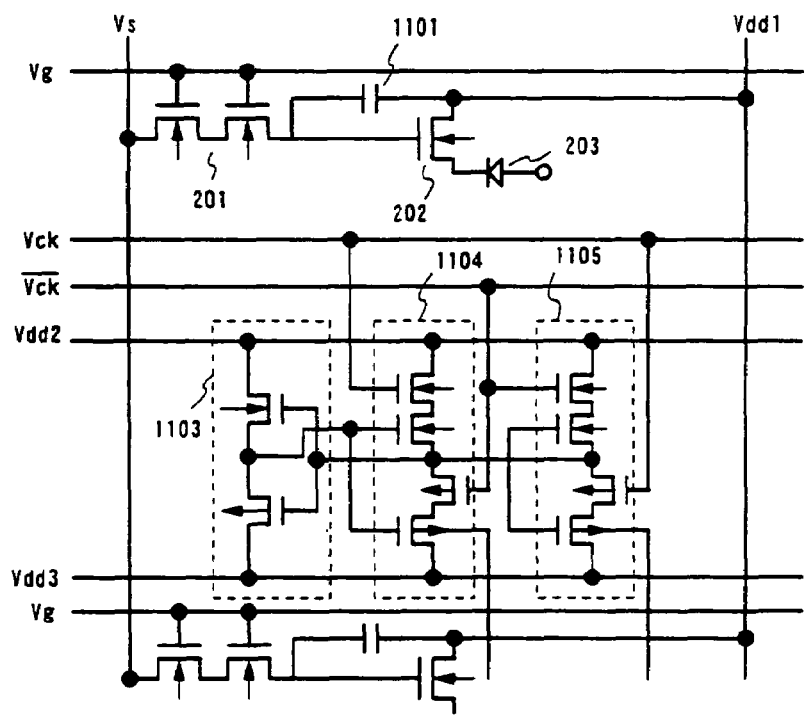

FIG. 11A is an enlarged top view of one pixel of the pixel portion, and FIG. 11B is a circuit diagram of the pixel. The switching TFT 201 and the current control TFT 202 have symbols corresponding to those of FIG. 1. Reference numeral 1101 denotes a storage capacitor, which fulfills a role of storing a voltage applied to a gate of the current control TFT 202 for one frame period. Note that, provided that the off current of the TFT is reduced as much as possible by using a multi-gate structure for the switching TFT 202, it is possible to omit the storage capacitor 1101.

The storage capacitor 1101 is formed between a gate electrode of the current control TFT 202 and a current supply line 1102 in embodiment 4. The capacitor may also be formed, of course, between a source region of the current control TFT and a gate electrode (including a gate wiring) of the current control TFT 202.

Furthermore, a portion (a flip-flop circuit) of the shift register is shown inside the pixel, and one flip-flop circuit is formed by the following three: an inverter 1103, and clocked inverters 1104 and 1105. The flip-flop is connected in series in an actual shift register.

In addition, $V_g$ is a gate signal, $V_s$ is a source signal (data signal), $V_{dd1}$ (the current supply line 1102) is a cathode signal imparted to a cathode of the EL element 203, $V_{ck}$ is a clock signal (a bar over $V_{ck}$ means an inverted signal $\overline{V_{ck}}$), $V_{dd2}$ is a clocked inverter front side signal, and $V_{dd3}$ is a load side signal of a clocked inverter. Note that a ground electric potential is imparted to $V_{dd1}$ in embodiment 4.

One flip-flop circuit is formed in one pixel with a structure as in embodiment 4, and is connected in series with a separate flip-flop circuit formed inside an adjoining pixel. When $V_{ck}$ then crosses over between pixels, connecting wirings 1106 to 1115 may be used, as is the connecting wiring denoted by reference numeral 1004 in FIG. 10.

Note that the connecting wirings 1114 and 1115 may be formed at the same time as the data wiring and the current supply line. In other words, it does not become a problem if the intersection is not on the same layer, and when one wiring crosses another wiring, the operator may suitably set on which layer to form the other wiring.

Note that it is possible to freely combine the constitution of embodiment 4 with the constitution of any of embodiments 1 to 3.

Embodiment 5

Figure 12:
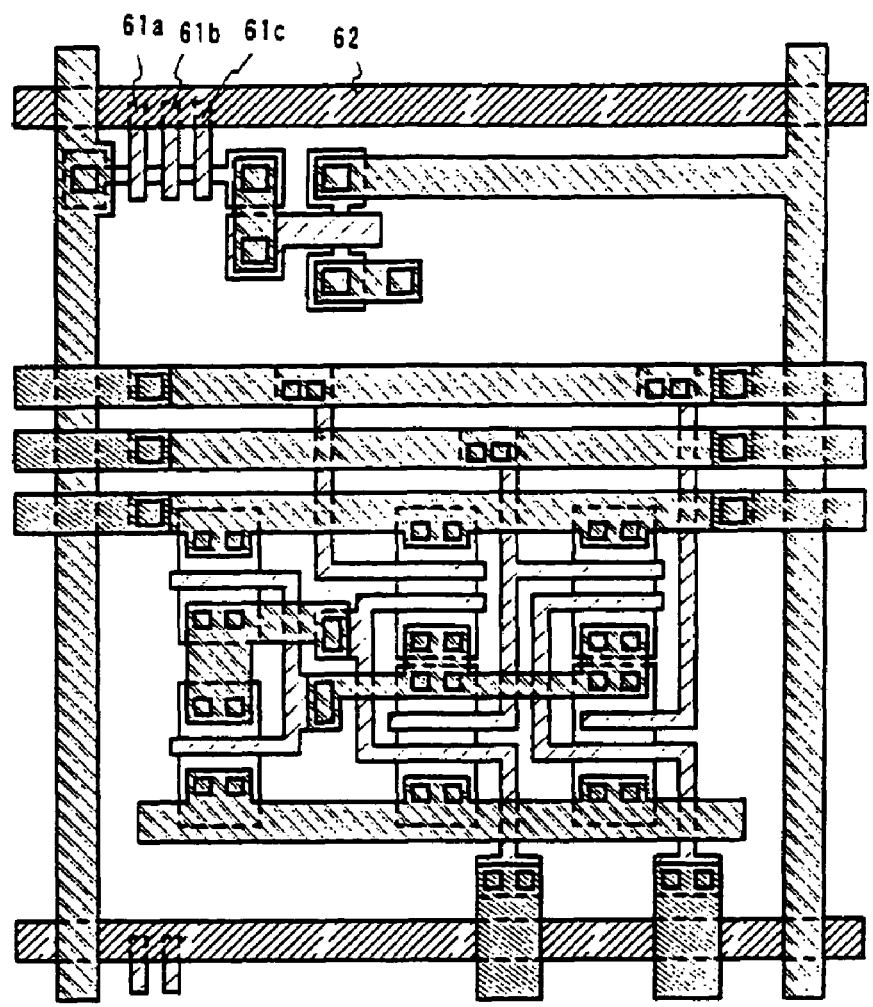
FIG. 12 is a diagram showing the top structure of a pixel portion of an EL display device.

An example of the structure of a pixel of an active matrix type EL display device which differs from that of embodiment 4 is explained in embodiment 5. Specifically, an example is shown in FIG. 12 of a different material for the gate wiring in the pixel structure shown in FIG. 11. Note that the structure of FIG. 12 is nearly the same as that of FIG. 11, and therefore only portions which differ are explained.

In embodiment 5, the off current is set equal to or less than 10 pA (preferably equal to or less than 1 pA) by using a triple gate structure for a switching TFT. The storage capacitor 1101 shown in FIG. 11 is therefore omitted.

In FIG. 12, reference numerals 61*a* to 61*c* denote gate electrodes formed by a lamination film of a tungsten nitride film and a tungsten film, similar to the gate electrodes of embodiment 1. These may each be formed in an independent pattern, as shown in FIG. 12, and may be formed in a pattern in which each is electrically connected, but the gate electrodes are in an electrically floating state at the time of formation.

Other conducting films such as a lamination film of a tantalum nitride film and a tantalum film, or an alloy film of molybdenum and tungsten may also be used as the gate electrodes 61*a* to 61*c*. However, it is preferable to use a film having superior processing characteristics of being able to be formed with a fine line width equal to or less than 3 μm (preferably equal to or less than 2 μm). Further, for the insulating film it is preferable to use a film which does not contain an element which will diffuse and enter the active layer.

On the other hand, a conducting film having a resistance lower than that of the gate electrodes 61*a* to 61*c* is used as a gate wiring 62, typically an alloy film having aluminum as its principal constituent, or an alloy film having copper as its principal constituent. No particular fine processing characteristics are required in the gate wiring 62. Further, the gate wiring does not overlap with the active layer, and therefore it does not become a problem if the gate wiring contains aluminum or copper, which easily diffuse throughout the insulating film.

In making the structure of embodiment 5, it is good to perform an activation process before forming the first interlayer insulating film 544 in the step of FIG. 4D in embodiment 1. In this case heat treatment is added with the gate electrodes 61*a* to 61*c* in an exposed state, but the gate electrodes 61*a* to 61*c* will not be oxidized by performing heat treatment in a sufficiently inert atmosphere, preferably one in which the oxygen concentration is equal to or less than 1 ppm. Namely, there is no increase in the resistance value due to oxidation, and the gate electrodes will not be covered by an insulating film (an oxide film) which is not easily removed.

A conducting film having aluminum or copper as its principal constituent is then formed after completing the activation process, and the gate wiring 62 may be formed by patterning. A good ohmic contact is maintained in the contacting portions between the gate electrodes 61a to 61c and the gate wiring 62 at this point, and it becomes possible to apply a predetermined gate voltage to the gate electrodes 61a to 61c.

The lowering of the wiring resistance of the gate wiring as much as possible by a structure such as that of embodiment 5 is extremely effective in reducing wiring lags. Note that the pixel structure shown in FIG. 12 in embodiment 5 does not place any limitations on the present invention, and is only one preferred example. Further, it is possible to freely combine the constitution of embodiment 5 with the constitution of any of embodiments 1 to 3.

Embodiment 6

It is effective to use a material having a high thermal radiation effect as the base film 12 formed between the active layer and the substrate 11 in the structure shown in FIG. 1. In particular, a relatively large amount of current flows in the current control TFT over a long amount of time, and therefore the current control TFT easily heats up, and degradation due to self heating can become a problem. In such a case, the thermal degradation of the TFT can be controlled by making the base film have a thermal radiation effect as in embodiment 6.

A insulating film containing at least one element selected from the group consisting of B (boron), C (carbon), and N (nitrogen), and containing at least one element selected from the group consisting of Al (aluminum), Si (silicon), and P (phosphorous) can be given as a light transmitting material possessing heat radiating characteristics.

For example, it is possible to use: an aluminum nitride compound, typically aluminum nitride ($Al_xN_y$); a silicon carbide compound, typically silicon carbide ($Si_xC_y$); a boron nitride compound, typically boron nitride ($B_xN_y$); or a boron phosphate compound, typically boron phosphate ($B_xP_y$). Further, an aluminum oxide compound, typically aluminum oxide ($Al_xO_y$), has superior light transparency characteristics, and has a thermal conductivity of 20 $Wm^{-1}K^{-1}$, and can be said to be one of the preferable materials. Note that x and y are arbitrary integers for the above transparent materials.

The above chemical compounds can also be combined with another element. For example, it is possible to use nitrided aluminum oxide, denoted by $AlN_xO_y$, in which nitrogen is added to aluminum oxide. This material also not only possesses a heat radiating effect, but also is effective in preventing the penetration of substances such as moisture and alkaline metals. Note that x and y are arbitrary integers for the above nitrided aluminum oxide.

Furthermore, the materials disclosed in Japanese Patent Application Laid-open No. Sho 62-90260 can also be used. Namely, an insulating film containing Si, Al, N, O, and M can also be used (note that M is a rare-earth element, preferably an element selected from the group consisting of Ce (cesium), Yb (ytterbium), Sm (samarium), Er (erbium), Y (yttrium), La (lanthanum), Gd (gadolinium), Dy (dysprosium), and Nd (neodymium)). These materials not only possess heat radiating effects, but also are effective in preventing the penetration of substances such as moisture and alkaline metals.

Further, carbon films such as a diamond thin film or amorphous carbons (especially those which have characteristics close to those of diamond; referred to as diamond like carbon) can also be used. These have very high thermal conductivities, and are extremely effective as radiation layers. Note that if the film thickness becomes large, then there is brown banding and the transmissivity is reduced, and therefore it is preferable to use as thin a film thickness (preferably between 5 and 100 nm) as possible.

In addition, a thin film made from a material having the above thermal radiation effect can be used by itself, and a lamination of these thin films and an insulating film containing silicon may be used.

Note that it is possible to freely combine the constitution of embodiment 6 with the constitution of any of embodiments 1 to 5.

Embodiment 7

It is preferable to use an organic EL material as the EL layer in embodiment 1, but the present invention can also be implemented using an inorganic EL material. However, present inorganic EL materials have an extremely high driving voltage, and therefore a TFT having a voltage resistance which can withstand such a driving voltage must be used.

On the other hand, provided that inorganic EL materials with lower driving voltages are developed in the future, it will be possible to apply them to the present invention.

Further, it is possible to freely combine the constitution of embodiment 7 with the constitution of any of embodiments 1 to 6.

Embodiment 8

An active matrix type EL display device (EL module) formed by implementing the present invention has superior visibility in bright locations in comparison to a liquid crystal display device because it is a self-emitting type device. It is therefore possible to implement the present invention in a direct-vision EL display (indicating a display incorporating an EL module). The following can be given as examples of such EL displays: a personal computer monitor: a television broadcast receiving monitor; and an advertisement display monitor.

Further, it is possible to implement the present invention for all electronic devices containing a display, including the above EL display, as a component.

The following can be given as examples of such electronic devices: an EL display; a video camera; a digital camera; a head mounted display; a car navigation system; a personal computer; a portable information terminal (such as a mobile computer, a mobile telephone, or an electronic book); and an image playback device using a recording medium (specifically, a device which performs playback of a recording medium and is provided with a display which can display those images, such as a compact disk (CD), a laser disk (LD), or a digital video disk (DVD)). Examples of these electronic devices are shown in FIGS. 13A to 13F.

FIG. 13A is a personal computer, containing a main body 2001, a casing 2002, a display portion 2003, and a keyboard 2004. The present invention can be used in the display portion 2003.

FIG. 13B is a video camera, containing a main body 2101, a display portion 2102, an audio input portion 2103, operation switches 2104, a battery 2105, and an image receiving portion 2106. The present invention can be used in the display portion 2102.

FIG. 13C is a portion of a head mounted EL display (the right side), containing a main body 2301, a signal cable 2302, a head fixing band 2303, a display monitor 2304, an optical system 2305, and a display device 2306. The present invention can be used in the display device 2306.

FIG. 13D is an image playback device (specifically, a DVD playback device) provided with a recording medium, containing a main body 2401, a recording medium (such as a CD, an LD, or a DVD) 2402, operation switches 2403, a display portion (a) 2404, and a display portion (b) 2405. The display portion (a) is mainly used for displaying image information, and the image portion (b) is mainly used for displaying character information, and the present invention can be used in the image portion (a) and in the image portion (b). Note that the present invention can be used as an image playback device provided with a recording medium in devices such as a CD playback device and game equipment.

FIG. 13E is a mobile computer, containing a main body 2501, a camera portion 2502, an image receiving portion 2503, operation switches 2504, and a display portion 2505. The present invention can be used in the display portion 2505.

FIG. 13F is an EL display, containing a casing 2601, a support stand 2602, and a display portion 2603. The present invention can be used in the display portion 2603. The EL display of the present invention is especially advantageous for cases in which the screen is made large, and is favorable for displays having a diagonal greater than or equal to 10 inches (especially one which is greater than or equal to 30 inches) because of its wide range of visibility.

Furthermore, if the emission luminance of EL materials becomes higher in the future, then it will become possible to use the present invention in a front type or a rear type projector by expanding and projecting output light containing image information using a lens or the like.

The range of applications of the present invention is thus extremely wide, and it is possible to apply the present invention to electronic devices in all fields. In addition, the electronic device of embodiment 8 can also be realized using a constitution of any type of combination of embodiments 1 to 7.

By implementing the present invention, it becomes possible to form a driving circuit and other signal processing circuits in the inside of a pixel portion (in the same region as the pixel portion) in an active matrix type EL display device operating with light output from the side opposite that of a substrate, and miniaturization of the active matrix type EL display device is achieved.

Further, a high reliability active matrix type EL display device is realized by arranging optimally structured TFTs for the TFTs formed on the substrate, adapted to the performance required by circuits and elements.

By then installing this type of active matrix EL display device as a display, it becomes possible to produce a small size electronic device having high reliability.

What is claimed is:

1. A camera comprising:
a display portion;
operation switches;
an image receiving portion,
the display portion comprising:
a pixel portion formed over a substrate, the pixel portion comprising a plurality of pixels and each of the plurality of pixels comprising at least one thin film transistor, a pixel electrode connected with the thin film transistor, and a light emitting element formed over the pixel electrode; and
a driver circuit formed among the plurality of pixels,
wherein at least a part of the driver circuit is covered with the pixel electrode.

2. A camera according to claim 1, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

3. A camera comprising:
a display portion;
operation switches;
an image receiving portion,
the display portion comprising:
a pixel portion comprising at least first and second pixels formed over a substrate, each of the first and second pixels comprising a first thin film transistor connected with a pixel electrode, a second thin film transistor located below the pixel electrode, and a light emitting element formed over the pixel electrode,
wherein the driver circuit includes the second thin film transistors of the first and second pixels, and
wherein the driver circuit is formed in the pixel portion.

4. A camera according to claim 3, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

5. A camera comprising:
a display portion;
operation switches;
an image receiving portion,
the display portion comprising:
a pixel portion formed over a substrate, the pixel portion comprising at least first and second pixels each of which comprises a light emitting element; and
a driver circuit formed in the pixel portion, the driver circuit comprising at least first and second portions,
wherein the first portion comprises a first thin film transistor and the second portion comprises a second thin film transistor, and
wherein the first thin film transistor is formed in the first pixel and the second thin film transistor is formed in the second pixel.

6. A camera according to claim 5, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

7. A camera according to claim 5, wherein each of the pixels comprises a third thin film transistor connected to the light emitting element.

8. A portable information terminal comprising:
an image receiving portion;
operation switches; and
a display portion, the display portion comprising:
a pixel portion formed over a substrate, the pixel portion comprising a plurality of pixels and each of the plurality of pixels comprising at least one thin film transistor, a pixel electrode connected with the thin film transistor, and a light emitting element formed over the pixel electrode; and
a driver circuit formed among the plurality of pixels,
wherein at least a part of the driver circuit is covered with the pixel electrode.

9. A camera according to claim 8, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

10. A portable information terminal comprising:
an image receiving portion;
operation switches; and
a display portion,
the display portion comprising:
a pixel portion comprising at least first and second pixels formed over a substrate, each of the first and second pixels comprising a first thin film transistor connected with a pixel electrode, a second thin film transistor located below the pixel electrode, and a light emitting element formed over the pixel electrode,
wherein the driver circuit includes the second thin film transistors of the first and second pixels, and
wherein the driver circuit is formed in the pixel portion.

11. A camera according to claim 10, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

12. A portable information terminal comprising:
an image receiving portion;
operation switches; and
a display portion,
the display portion comprising:
a pixel portion formed over a substrate, the pixel portion comprising at least first and second pixels each of which comprises a light emitting element; and
a driver circuit formed in the pixel portion, the driver circuit comprising at least first and second portions,
wherein the first portion comprises a first thin film transistor and the second portion comprises a second thin film transistor, and
wherein the first thin film transistor is formed in the first pixel and the second thin film transistor is formed in the second pixel.

13. A camera according to claim 12, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

14. A camera according to claim 12, wherein each of the pixels comprises a third thin film transistor connected to the light emitting element.

15. A computer comprising:
a display portion; and
a keyboard,
the display portion comprising:
a pixel portion formed over a substrate, the pixel portion comprising a plurality of pixels and each of the plurality of pixels comprising at least one thin film transistor, a pixel electrode connected with the thin film transistor, and a light emitting element formed over the pixel electrode; and
a driver circuit formed among the plurality of pixels,
wherein at least a part of the driver circuit is covered with the pixel electrode.

16. A camera according to claim 15, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

17. A computer comprising:
a display portion; and
a keyboard,
the display portion comprising:
a pixel portion comprising at least first and second pixels formed over a substrate, each of the first and second pixels comprising a first thin film transistor connected with a pixel electrode, a second thin film transistor located below the pixel electrode, and a light emitting element formed over the pixel electrode,
wherein the driver circuit includes the second thin film transistors of the first and second pixels, and
wherein the driver circuit is formed in the pixel portion.

18. A camera according to claim 17, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

19. A computer comprising:
a display portion; and
a keyboard,
the display portion comprising:
a pixel portion formed over a substrate, the pixel portion comprising at least first and second pixels each of which comprises a light emitting element; and
a driver circuit formed in the pixel portion, the driver circuit comprising at least first and second portions,
wherein the first portion comprises a first thin film transistor and the second portion comprises a second thin film transistor, and
wherein the first thin film transistor is formed in the first pixel and the second thin film transistor is formed in the second pixel.

20. A camera according to claim 19, wherein the driver circuit is one selected from the group consisting of a shift register, a level shifter, a buffer, a latch, a D/A converter, a sampling circuit, a wave divider circuit, a booster circuit, a γ compensation circuit, a memory, and a differential amplifier circuit.

21. A camera according to claim 19, wherein each of the pixels comprises a third thin film transistor connected to the light emitting element.

* * * * *